(12) United States Patent
Ito

(10) Patent No.: US 8,055,977 B2
(45) Date of Patent: Nov. 8, 2011

(54) DECODING DEVICE, ENCODING/DECODING DEVICE AND RECORDING/REPRODUCING DEVICE

(75) Inventor: Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 972 days.

(21) Appl. No.: 11/977,266

(22) Filed: Oct. 24, 2007

(65) Prior Publication Data
US 2008/0104481 A1    May 1, 2008

(30) Foreign Application Priority Data

Oct. 30, 2006 (JP) ................................ 2006-294185
Sep. 10, 2007 (JP) ................................ 2007-234267

(51) Int. Cl.
*G06F 11/10* (2006.01)
(52) U.S. Cl. ......................................................... 714/758
(58) Field of Classification Search .................... 714/758
See application file for complete search history.

(56) References Cited

U.S. PATENT DOCUMENTS

| | | | | |
|---|---|---|---|---|
| 5,793,779 A * | 8/1998 | Yonemitsu et al. | ........... | 714/764 |
| 6,035,433 A * | 3/2000 | Sako et al. | ........... | 714/764 |
| 6,289,485 B1 * | 9/2001 | Shiomoto | ........... | 714/779 |
| 6,553,536 B1 | 4/2003 | Hassner et al. | | |
| 6,965,652 B1 * | 11/2005 | Burd et al. | ........... | 375/341 |
| 7,216,286 B2 * | 5/2007 | Hoshizawa et al. | ........... | 714/785 |
| 7,409,622 B1 * | 8/2008 | Lu et al. | ........... | 714/755 |
| 7,453,960 B1 * | 11/2008 | Wu et al. | ........... | 375/340 |
| 7,530,003 B2 * | 5/2009 | Lee et al. | ........... | 714/759 |
| 7,680,108 B2 * | 3/2010 | Yu et al. | ........... | 370/389 |
| 7,913,152 B2 * | 3/2011 | Jeong et al. | ........... | 714/786 |
| 2003/0099303 A1 * | 5/2003 | Birru et al. | ........... | 375/265 |
| 2005/0102605 A1 | 5/2005 | Gupta | | |
| 2006/0195760 A1 | 8/2006 | Lee et al. | | |

FOREIGN PATENT DOCUMENTS

| | | |
|---|---|---|
| JP | 11-330985 | 11/1999 |
| JP | 2001-352252 | 12/2001 |
| JP | 2003-518866 | 6/2003 |
| JP | 2004-282600 | 10/2004 |
| WO | WO 97/09791 A1 | 3/1997 |

OTHER PUBLICATIONS

E.R. Berlekamp; "Algebraic Coding Theory"; McGraw-Hill Book Co.; pp. 176-199 and 218-240; 1968.
J.L. Massay; "Shift-register Synthesis and BCH Decoding"; IEEE Transactions on Information Theory, vol. IT-15; pp. 122-127; 1969.
Chinese Office Action and its English translation, issued Aug. 21, 2009.

* cited by examiner

*Primary Examiner* — James C Kerveros
(74) *Attorney, Agent, or Firm* — Greer, Burns & Crain, Ltd.

(57) ABSTRACT

An encoding/decoding device corrects errors by concatenated codes of an ECC code and a parity code to prevent an increase in the circuit scale and to improve error correction performance. The device has encoders for creating a concatenation type encoded data by interleaving a data string into a plurality of blocks at every m (m≧2) bit, adding a parity of an error correcting code and adding a parity bit at every predetermined number of bits for preventing an increase in the circuit scale even if the data string is interleaved into a plurality of blocks, and a parity of error correcting code is generated. Also ECC decoding circuits for correcting an ECC decoded data string using the likeliness of a soft output decoder and parity check result are provided, so a deterioration of correction performance can also be prevented.

14 Claims, 27 Drawing Sheets

```
        1 0 1 1
     ┌─────────────
1 1 1 │ 1 1 0 0 1 ...
        1 1 1
        ─────
          1 0 1 ...
          1 1 1
          ─────
            1 0 ...
            1 1 1
            ─────
                ⋰
              ─────
                0 1
```

FIG.12
| 20-BIT BLOCK | 0 | 1 | 2 | 3 | 4 | 5 | 6 | 7 | 8 | ... |
|---|---|---|---|---|---|---|---|---|---|---|
| | 22.5 | -3.5 | 0.6 | -0.6 | 10.5 | 48.2 | 22.5 | -3.5 | 0.3 | ... |
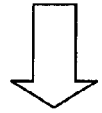
| LIKELIHOOD | POSITION INFORMATION | | | | | |
|---|---|---|---|---|---|---|
| 0.3 | 8 | | | | | |
| 0.6 | 2 | 3 | | | | |
FIG.13
2-BIT PARITY
| 0 | 1 |
|---|---|
| 2.5 | 14.3 |
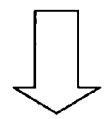
LIKELIHOOD
| 2.5 | 0 | |
|---|---|---|
| 14.3 | 1 | |
FIG.14
124
| | LIKELIHOOD | POSITION INFORMATION | | | | | |
|---|---|---|---|---|---|---|---|
| 20-BIT BLOCK 1 | 0.3 | 8 | | | | | |
| | 0.6 | 2 | 3 | | | | |
| 20-BIT BLOCK 2 | 0.1 | 2 | | | | | |
| | 0.5 | 5 | 6 | | | | |
| 20-BIT BLOCK 3 | 0.2 | 1 | 2 | 3 | 4 | | |
| | 0.8 | 10 | | | | | |
| 20-BIT BLOCK 4 | 1.5 | 11 | 12 | | | | |
| | 2.2 | 15 | 16 | 17 | 18 | 19 | |
| 2-BIT PARITY | 2.5 | 0 | | | | | |
| | 14.3 | 1 | | | | | |

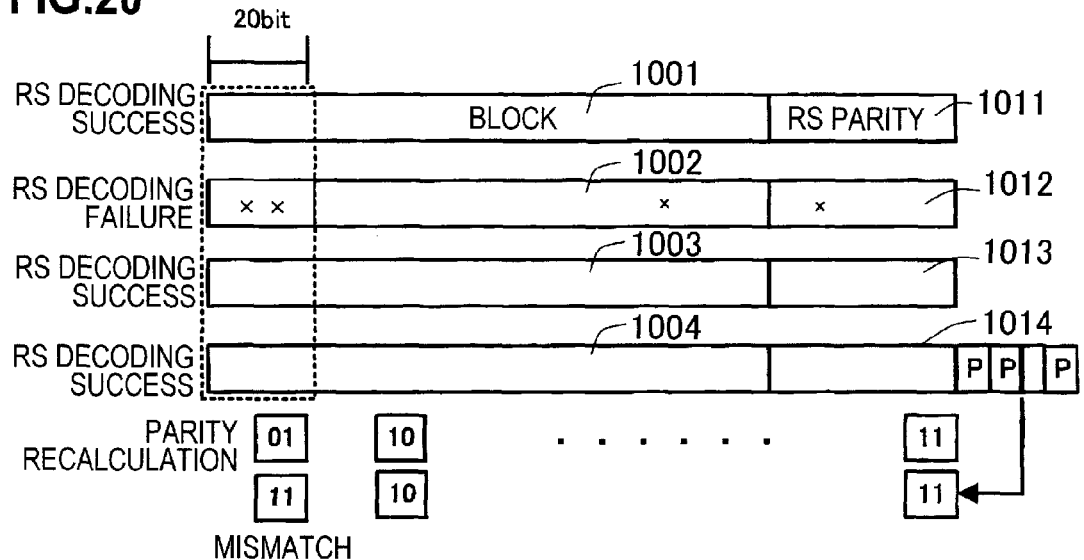
FIG.20
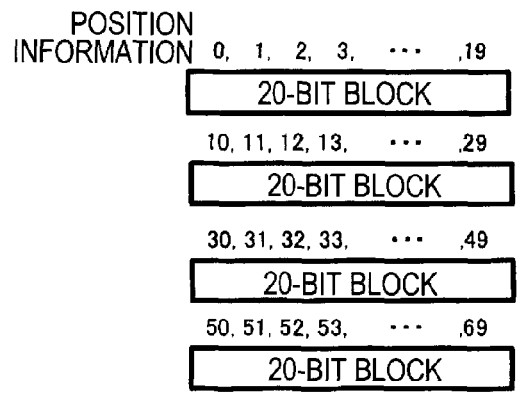
FIG.21
FIG.22

PARITY ERROR VALUE 3k+1b ERROR START POSITION (k = 0, 1, ...)

| 0 1 | 1, 4, 7 · · · 22, 25 · · |
|---|---|
| 1 0 | 0, 3, 6 · · · 21, 24 · · |
| 1 1 | 2, 5, 8 · · · 23, 26 · · · |

PARITY ERROR VALUE 3k+2b ERROR START POSITION (k = 0, 1, ...)

| 0 1 | 2, 5, 8 · · · 26 · · · · |
|---|---|
| 1 0 | 1, 4, 7 · · · 25 · · · · |
| 1 1 | 0, 3, 6 · · · 24 · · · · |

FIG.32

| | LIKELIHOOD | | POSITION INFORMATION | | | | |
|---|---|---|---|---|---|---|---|
| 20-BIT BLOCK 1 | 0.01 | 8 | | | | | |
| | 0.01 | 2 | | | | | |
| 20-BIT BLOCK 2 | 0.1 | 2 | 3 | | | | |
| | 0.3 | 5 | | | | | |
| 20-BIT BLOCK 3 | 0.02 | 1 | | 6 | | | |
| | 0.02 | 10 | | 2 | 3 | 4 | |
| 20-BIT BLOCK 4 | 0.4 | 11 | | 12 | | | |
| | 0.2 | 15 | | 16 | 17 | 18 | 19 |
| 2-BIT PARITY | 2.5 | 0 | | | | | |
| | 14.3 | 1 | | | | | |

124 POSITION INFORMATION

FIG.37 PRIOR ART

| j | 4 | 3 | 2 | 1 | 0 |
|---|---|---|---|---|---|
| | | INFORMATION STRING | | PARITY STRING | |
| GALOIS FIELD REPRESENTATION | 1 | $\alpha^5$ | $\alpha^4$ | $\alpha^4$ | $\alpha^4$ |
| BIT REPRESENTATION | 001 | 110 | 101 | 101 | 101 |

FIG.38 PRIOR ART $$x^2 + \alpha^3 x + \alpha \overline{\smash{\big)}\, x^4 + \alpha^5 x^3 + \alpha^4 x^2}$$
$$\phantom{x^2 + \alpha^3 x + \alpha)} \overline{\phantom{xxxxxxxxxxxxxxxxxxxxx} \alpha^4 x + \alpha^4}$$

quotient: $x^2 + \alpha^2 x + \alpha^3$

FIG.39 PRIOR ART

| j | 4 | 3 | 2 | 1 | 0 |
|---|---|---|---|---|---|
| TRANSMISSION WORD STRING : F | 1 | $\alpha^5$ | $\alpha^4$ | $\alpha^4$ | $\alpha^4$ |
| RECEIVE WORD STRING : Y | $\alpha$ | $\alpha^5$ | $\alpha^4$ | $\alpha^4$ | $\alpha^4$ |
| POSITION INFORMATION | [ $\alpha^4$ | $\alpha^3$ | $\alpha^2$ | $\alpha$ | 1 ] |

FIG.41 PRIOR ART
ONE-INTERLEAVE
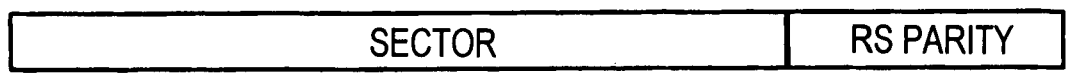
FIG.42 PRIOR ART
FOUR-INTERLEAVE
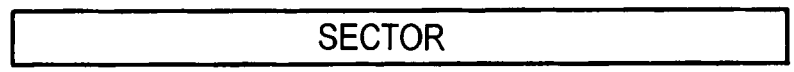
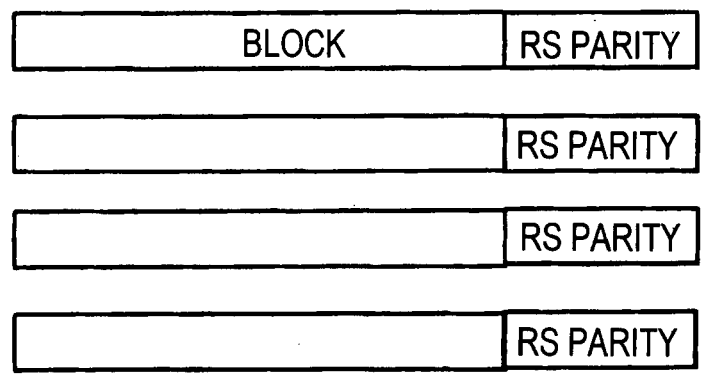

DECODING DEVICE, ENCODING/DECODING DEVICE AND RECORDING/REPRODUCING DEVICE

CROSS-REFERENCE TO RELATED APPLICATIONS

This application is based upon and claims the benefit of priority from the prior Japanese Patent Applications No. 2006-294185, filed on Oct. 30, 2006, and No. 2007-234267, filed on Sep. 10, 2007, the entire contents of which are incorporated herein by reference.

BACKGROUND OF THE INVENTION

1. Field of the Invention

The present invention relates to an encoding device, decoding device, encoding/decoding device and recording/reproducing of data including an error correcting code used for a recording/reproducing device and a communication device, and more particularly to an encoding device, decoding device, encoding/decoding device and recording/reproducing device for an error correction of a data block in which an ECC code is added.

2. Description of the Related Art

In a field of such a recording/reproducing device as a magnetic disk device, and a communication system, a data decoding technology using maximum likelihood sequence detection and an error correction technology using ECC (Error Correction Code) are widely used to improve the reliability of data reproduction when data is reproduced from low quality transmission signals and recording/reproducing signals.

RS (Reed Solomon) code is used as this ECC code. In a bit string which is output from a maximum Likelihood detection unit, an incorrect value enters in several bits because of the influence of the medium noise and the circuit noise. In ECC, a bit string having an error is corrected, and an error-corrected bit string is output. For example, in the case of a magnetic disk device, retry is required if ECC correction fails, but retry should be avoided as much as possible. So it is proposed that some candidate strings are received from a maximum likelihood detector, and whether the candidate string can be decoded with ECC is sequentially tried (e.g. Japanese Patent Application Laid-Open No. H11-330985).

FIG. 37 to FIG. 39 are diagrams depicting an error correction operation based on Reed Solomon codes, and FIG. 40 is a block diagram depicting a conventional error correction circuit using a maximum likelihood sequence.

First encoding will be described. As FIG. 37 shows, a Reed Solomon code with the number of error corrections t is generated by a generation polynomial of degree 2t. For example, if the Galois field used for encoding is GF (third power of 2), and if the number of error corrections t is "1", then the generation polynomial of the Reed Solomon code is given by the following Expression (1), for example, using a primitive element $\alpha$.

[Expression 1]

$$G(x) = (x - 1) \cdot (x - \alpha)$$
$$= x^2 + \alpha^3 x + \alpha \qquad (1)$$

In this example, three bits of a bit string are handled as one symbol, and a parity string with the 2t (=2) symbols is added to the information string in ECC encoding. For example, in the case of encoding the information string in FIG. 37, the information strings (bit representation) "001", "110" and "101" correspond to 1, the fifth power of $\alpha$, and the fourth power of $\alpha$ in the Galois field representation respectively. The j-th symbol here indicates the coefficient of the term $x^j$ of the polynomial of the transmission word string. Therefore the bit string (information string) represents the polynomial $x^4 + \alpha^5 x^3 + x^4 x^2$.

As FIG. 38 shows, in ECC encoding, a polynomial represented by a bit string is divided by the generation polynomial of Expression (1), and a parity string which represents the acquired remainder polynomial $\alpha^4 x + \alpha^4$ is added to the bit string. Since the coefficient of the terms of degree 1 and degree 0 of x are both $\alpha^4$ in the remainder polynomial, a parity string shown in FIG. 37 is added, and a transmission word string comprised of five symbols is generated.

If this transmission word string is recorded on a magnetic disk and is read, for example, a receive word string, including an error, may be input to the ECC decoder, as shown in FIG. 39. This receive word string is given by the following Expression (2).

[Expression 2]

$$Y(x) = \alpha x^4 + \alpha^5 x^3 + \alpha^4 x^2 + \alpha^4 x + \alpha^4 \qquad (2)$$

As FIG. 40 shows, in the receive side error correction circuit, a maximum likelihood detector 20 creates a plurality of candidate data strings from the input signals according to the maximum likelihood sequence. A data storage section 31 stores a plurality of created candidate data strings. An ECC decoder 22 is comprised of a syndrome calculation section 41, an error locator polynomial calculation section 42, a chien search execution section 43 and an error value calculation section 44.

The syndrome calculation section 41 calculates a syndrome calculation expression (described later) of the data string which is input to the ECC decoder 22. The error locator polynomial calculation section 42 calculates an error locator polynomial (described later) from the syndrome polynomial. For the calculation algorithm of the error locator polynomial, the Euclid method or Berlekamp Massey method, for example, is used (e.g. E. R. Berlekamp, "Algebraic Coding Theory", McGraw-Hill Book Co., pp. 176 to 199 and pp. 218 to 240, New York, 1968, and J. L. Massay, "Shift-register Synthesis and BCH Decoding", IEEE Transactions on Information Theory, Vol. IT-15, pp. 122 to 127, 1969).

The chien search execution section 43 executes a chien search, and decides a position on a data string where an error exists (error position) using the above mentioned error locator polynomial. The error value calculation section 44 corrects an incorrect value at the error position to a correct value. Then a decoding judgment section 32 checks the validity of the data string after correction, which is output from the error value calculation section 44, and if not valid, the decoding judgment section 32 judges this as a correction failure, and instructs the data storage section 31 to output the next decoding candidate data string.

First the syndrome calculation section 41 calculates a syndrome polynomial for the receive word string in FIG. 39, for example, using the following Expression (3).

[Expression 3]

$$S(x) = s_1 + s_2 x$$

$$s_1 = Y(1)$$

$$s_2 = Y(\alpha) \qquad (3)$$

In Expression (3), a syndrome $s_i$ (i=1, 2, ..., 2t) is a value acquired by substituting the i-th root of the generation polynomial G (x) of Expression (1) in the receive word polynomial Y (x), and the syndrome polynomial S (x) is a polynomial where the syndrome $s_i$ is a coefficient of the term $x^{i-1}$. If no error is included in the receive word string, all of $s_i$ becomes "0".

Then the error locator polynomial calculation section 42 calculates the error locator polynomial C (x) of the following Expression (4) from the syndrome polynomial S (x) according to the Berlekamp Massey method.

[Expression 4]

$$C(x)=1+\alpha^{-4}x \quad (4)$$

Then using the error locator polynomial C (x) of Expression (4), the chien search execution section 43 calculates the value of C ($\alpha^j$) (j=0, 1, 2, 3, 4), and outputs position j where C ($\alpha^j$)=0 is established, as an error position. In the case of the example in FIG. 39, C ($\alpha^4$)=1+$\alpha^{-4}\cdot\alpha^4$=0, so it can be detected that an error exists in the fourth symbol.

Then the error value calculation section 44 calculates a correct value of the fourth symbol based on a predetermined algorithm using the syndrome polynomial S (x) of Expression (3) and the error locator polynomial C (x) of Expression (4), and this bit string is corrected. In this case, a correct value "1" is determined and the fourth symbol in the receive word string shown in FIG. 39 is corrected from $\alpha$ to "1".

In the case of a magnetic device, for example, the Reed Solomon code where the number of error corrections t=20 is used as shown in FIG. 41. In ECC encoding, 10 bits constitute one symbol, and a parity string comprised of 40 symbols is inserted before one sector of a bit string (4096 bits=410 symbols). In this case, the syndrome polynomial S (x) and the error locator polynomial C (x) are given by the following Expression (5) and (6), for example.

[Expression 5]

$$S(x)=s_1+s_2x+\ldots+s_{40}x^{39} \quad (5)$$

[Expression 6]

$$C(x)=1+x+\alpha^2x^2+\ldots+\alpha^{35}x^8 \quad (6)$$

On the other hand, when a block length is long, as shown in FIG. 42, the r interleave method may be used (FIG. 42 shows an example of an r=4 interleave). In other words, a block is divided into r number of blocks, and RS codes (ECC codes) are calculated for the divided blocks using the above mentioned polynomial, and added.

In terms of error correction performance, the 1 interleave method is better than the r interleave method. In other words, as FIG. 41 shows, in the case of the one interleave method, RS codes are created for an entire one block according to the above mentioned encoding and decoding principles, so correction is for an entire one block and performance is high. In the case of the r interleave method, RS codes are created for 1/r of one block, as shown in FIG. 42, so error correction is for 1/r of one block, and therefore performance is lower than the one interleave method.

For example, if one block is 4 kbytes (=32,000 bits), 12 bits of RS code must be used for each symbol as ECC code. In other words, if one symbol consists of 10 bits, the maximal number of bits is $2^{10}-1$=1023 symbols (=10230 bits), and one entire block cannot be corrected.

If one symbol consists of 12 bits, the target number of bits is $2^{12}-1$=4092 symbols (49104 bits), and one entire block can be corrected. However if the number of bits in one symbol is increased, the ECC encoder, decoder and buffer increases, and the circuit scale expands several times compared with the case of the current 10 bits in one symbol.

Whereas if the current one symbol 10 bit ECC is used, one interleave configuration cannot be used, instead a four interleave configuration must be used. But in this case, the error correction performance drops compared with the one interleave configuration.

SUMMARY OF THE INVENTION

With the foregoing in view, it is an object of the present invention to provide an encoder, a decoder, an encoding/decoding device and a recording/reproducing device for preventing an increase in the circuit scale and deterioration in the error correction performance.

It is another object of the present invention to provide an encoder, a decoder, an encoding/decoding device and a recording/reproducing device for preventing a deterioration in the error correction performance even if ECC encoding is performed with a multiple interleave configuration.

It is still another object of the present invention to provide an encoder, a decoder, an encoding/decoding device and a recording/reproducing device for implementing ECC encoding/decoding with a multiple interleave configuration with a small circuit scale and preventing a deterioration of the error correction performance.

To achieve these objects, an encoder of the present invention has: an ECC encoder for creating an error correcting code word by interleaving a data string into n (n≧2) blocks of data string at every m (m≧2) bit, generating a parity of an error correcting code from the interleaved data string of each block, adding the parity of said error correcting code of each block to the data string; and a parity encoder for creating a parity bit for every predetermined bits of error correcting code words, and adding the parity bit to error correcting code words.

A decoder of the present invention is a decoder for decoding an encoded data string where a parity of an error correcting code, that is generated from a data string of each block when a data string is interleaved into n (n≧2) blocks of a data string at every m(m≧2) bit, and a parity bit created for every predetermined bits of an error correcting code word, are added to the error correcting code word, having: a soft output decoder for decoding the encoded data string that is decoded to a code bit string and outputting the likelihood of each bit; and an ECC decoding circuit for repeating an error correction decoding using an error correcting code of the code bit string of the soft output decoder, and a correction decoding of the code bit string based on the likelihood according to the error detection using the parity bit.

An encoding/decoding device of the present invention has: an encoder having an ECC encoder for creating an error correcting code word by interleaving a data string into n (n≧2) blocks of a data string at every m(m≧2) bit, generating a parity of an error correcting code from the interleaved data string of each block, and adding the parity of the error correcting code of each block to the data string, and a parity encoder for creating a parity bit at every predetermined bits of error correcting code words, and adding the parity bit to error correcting code words; and a decoder having a soft output decoder for decoding the encoded data string that is decoded to a code bit string and outputting the likelihood of each bit, and an ECC decoding circuit for repeating an error correction decoding using an error correcting code of the code bit string of the soft output decoder and a correction decoding of the code bit string based on the likelihood according to the error detection using the parity bit.

A recording/reproducing device of the present invention has: a head for writing and reading data to/from a storage medium; an ECC encoder for creating an error correcting code word by interleaving a data string, which is to be written to the storage medium, into n (n≧2) blocks of a data string at every m(m≧2) bit, generating a parity of an error correcting code from the interleaved data string of each block, a parity encoder for creating a parity bit at every predetermined bits of error correcting code words, adding the parity bit to error correcting code words and outputting the result to the head; a soft output decoder for decoding an encoded data string read from the head to a code bit string and outputting the likelihood of each bit; and an ECC decoding circuit for repeating an error correction decoding using an error correcting code of the code bit string of the soft output decoder, and a correction decoding of the code bit string based on the likelihood according to the error detection using the parity bit.

In the present invention, it is preferable that the ECC encoder deinterleaves the data string of each block at every m bit, and restores it to the data string.

In the present invention, it is also preferable that the ECC encoder has an interleave section for interleaving the data string into n (n≧2) blocks of a data string at every m (m≧2) bit, an ECC encoding section for generating a parity of an error correcting code from the interleaved data string of each block, and a deinterleave section for deinterleaving the data string of each block at every m bit, restoring it to the data string, and adding a parity of the error correcting code to the restored data string.

In the present invention, it is also preferable that the ECC encoder generates a Reed Solomon code as the error correcting code.

In the present invention, it is also preferable that the parity encoder creates the parity by a remainder of the division of a polynomial.

In the present invention, it is also preferable that the ECC decoding circuit has an ECC decoder for performing error correction using an error correcting code of a code bit string of the soft output decoder, and a parity/likelihood correction unit for performing an error detection using the parity bit according to the failure of decoding of the ECC decoder, and correcting the code bit string that is input to the ECC decoder depending on the likelihood.

It is also preferable that the present invention further has: a separation section for separating the parity bit from the code bit string of the soft output decoder, and outputting the separated code bit string and parity bit to the parity/likelihood correction unit; an interleave section for interleaving the code bit string after the parity bit is separated into n (n≧2) blocks of a data string at every m(m≧2) bit; and a data storage section for storing the interleaved data string of each block, wherein the ECC decoder performs error correction of the data string of each block of the data storage section using the error correcting code, and the parity/likelihood correction unit corrects the data string of the data storage unit.

In the present invention, it is also preferable that when decoding fails, the parity/likelihood correction unit receives an identifier of the block in which the decoding fails from the ECC decoder, and performs correction using the likelihood targeting the m bits of data of which error is detected by the parity bit for the block in which the decoding fails.

In the present invention, it is also preferable that the parity/likelihood correction unit calculates a parity bit for every m×n bit of error correcting code words of the ECC decoder, and specifies the m bits of data of which error is detected, by comparison of the calculated parity bit for every m×n bit and the corresponding separated parity bit.

In the present invention, it is also preferable that the parity/likelihood correction unit calculates a parity error value from an addition result of the calculated parity bit after the error detection and the separated parity bit, and specifies an error generation position of the m bits of data by comparison of the parity bits.

In the present invention it is also preferable that the parity/likelihood correction unit specifies an error candidate bit based on the likelihood of each bit of the error-detected m bits.

In the present invention, it is also preferable that the parity/likelihood correction unit extracts a bit position of which likelihood is relatively low based on the likelihood of each bit out of the m bits as the correction candidate in m bit units.

In the present invention, it is also preferable that the parity/likelihood correction unit has a table of error candidate positions corresponding to the parity error values according to a generation polynomial of the parity bit, wherein the table is referred to by the parity error value, and the error generation position of the m bits of data is specified based on the reference result and the likelihood.

In the present invention, it is also preferable that the parity/likelihood correction unit flips the data at the error generation position of the m bits of data, and updates the data string of the data storage unit.

A data string is interleaved into a plurality of blocks and a parity of error correction code is added, and a concatenation type encoded data where a parity bit is added is created, so an increase in the circuit scale can be prevented even if the parity of the error correcting code is generated by interleaving into a plurality of blocks. Also a deterioration of the correction performance can be prevented, since the ECC decoded data string is corrected based on the likelihood of the soft output decoder and the parity check result.

BRIEF DESCRIPTION OF THE DRAWINGS

FIG. 12 is a diagram depicting an operation of the candidate selection section in FIG. 10.

FIG. 13 is a diagram depicting an operation of the parity sorting section in FIG. 10.

FIG. 14 is a diagram depicting the error candidate table in FIG. 10.

FIG. 20 is a diagram depicting an error position specifying operation by the parity check in FIG. 9.

FIG. 21 is a diagram depicting the parity error value in FIG. 19.

FIG. 22 is a diagram depicting a definition of a position number in the parity block in FIG. 19.

FIG. 32 shows an error candidate table of the decoding method according to another embodiment of the present invention;

FIG. 37 is a diagram depicting a conventional encoding operation for error correction.

FIG. 38 shows the parity string generation operation in FIG. 37.

FIG. 39 is a diagram depicting a conventional error correction operation.

FIG. 41 is a diagram depicting a conventional one-interleave configuration.

FIG. 42 is a diagram depicting a conventional four-interleave configuration.

PREFERRED EMBODIMENTS OF THE INVENTION

Embodiments of the present invention will now be described in the sequence of recording/reproducing system, error candidate extraction unit, encoder, ECC decoder, the other encoder, the other ECC decoder and other embodiments, but the present invention is not limited to these embodiments.

Recording/Reproducing System

Figure 1:
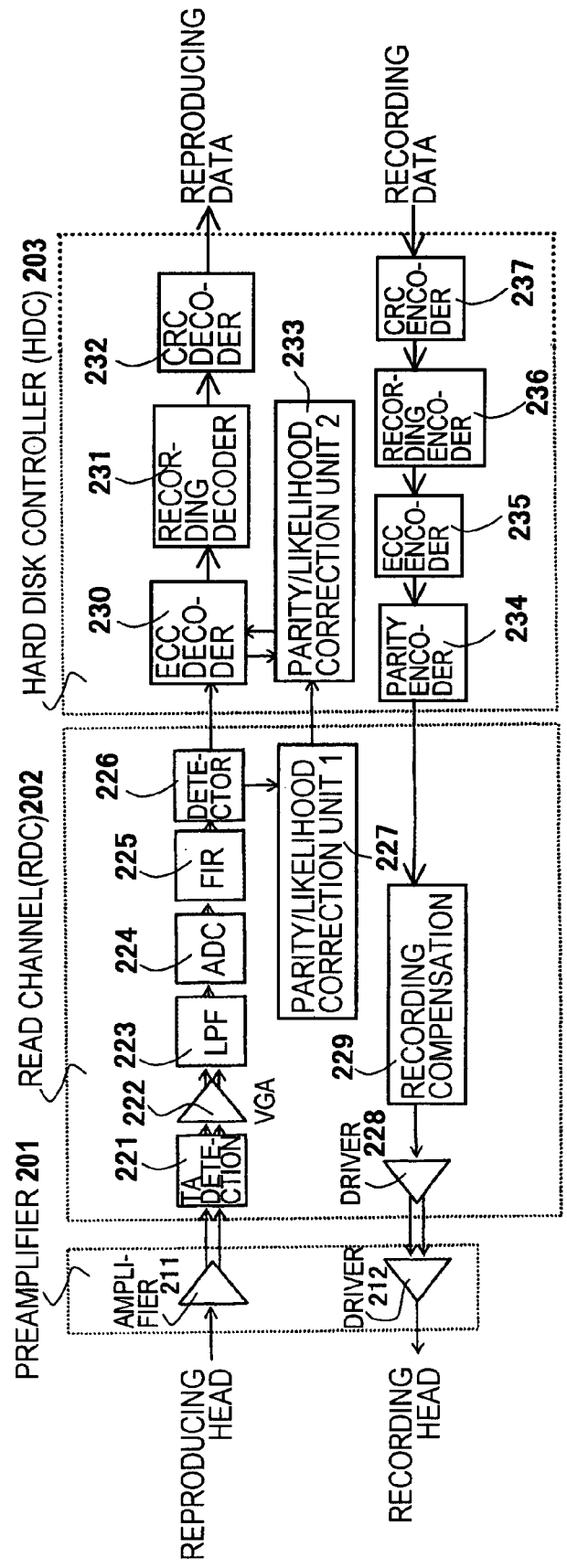
FIG. 1 is a block diagram depicting a recording/reproducing system of a medium storage device according to an embodiment of the present invention.

FIG. 1 is a block diagram depicting a recording/reproducing system of a magnetic disk device according to an embodiment of the present invention. As FIG. 1 shows, a recording/reproducing system of the magnetic disk device is largely divided into a hard disk controller (HDC) 203, a read channel (RDC) 202 and a preamplifier (or head IC) 201.

At recording, a CRC code (Cyclic Redundancy Code) is added to a recording data in a CRC encoder 237 in the HDC 203. Then a recording encoder 236 converts the recording data into a data string where such constraints as MTR (Maximum Transition Run) code and RLL (Run Length Limited) code are satisfied. And an ECC encoder 235 interleaves the recording data as described in FIG. 2 and later, and adds an RS parity string.

Then a parity encoder 234 determines a 2-bit parity for performing error detection which is separate from ECC, as described in FIG. 2 and later, and adds all the determined 2-bit parity to an ECC encoding data string.

The ECC-encoded data string, to which a parity is added, is input to the RDC 202, a recording compensation unit 229 in the RDC 202 performs compensation processing to lightly spread reversal interval in an area where magnetization reversal occurs adjacent to each other. Then a driver 228 in the RDC 202 outputs the data string, after the recording compensation is performed, to the preamplifier 201. In the preamplifier 201, a driver 212 generates the write current of a recording head (write head), which is not illustrated, drives the recording head, and records on a magnetic disk, which is not illustrated.

In the case of reproducing, on the other hand, an amplifier 211 of the preamplifier 201 amplifies the analog voltage from a reproducing head (read head), and outputs it to the RDC 202. A thermal asperity detection processing section 221 of the RDC 202 performs thermal asperity processing, then a variable gain amplifier (VGA) 222 adjusts the amplitude.

Then a low pass filter (LPF) 223 cuts the high frequency band of the read signals of which amplitude was adjusted, and an A/D converter (ADC) 224 converts the analog output into digital signals. Then an FIR (Finite Impulse Response) filter 225 performs PR (Partial Response) waveform equalization, and inputs the result to a soft output detector 226.

The soft output detector (decoder) 226 is such a soft output detector (decoder) as SOVA (Soft Output Viterbi), NPSOVA (Noise Predictive Soft Output Viterbi) and BCJR (Bahl, Cocke, Jelinek and Raviv Algorithm), and performs maximum likelihood decoding.

A first parity/likelihood correction unit 227 determines position information of an error candidate using the likelihood determined by the detector 226, and creates a table of likelihood and position information. The decoded string which is hard-judged to 0 or 1 by the soft output detector 226 is sent to the HDC 203. An ECC decoder 230 performs error correction with a four interleave configuration.

If the decoding succeeds, a recording decoder 231 performs recording, which is reverse of the encoding of the recording encoder 236, and a CRC decoder 232 performs CRC decoding, and outputs the result as reproducing data.

If decoding fails in the ECC decoder 230, the data is input to a second parity/likelihood correction unit 233. The second parity/likelihood correction unit 233 corrects the block where ECC correction fails, using the likelihood and position information table of the first parity/likelihood correction unit 227.

The data corrected by the second parity/likelihood correction unit 233 is input to the ECC decoder 230, where error correction by ECC is performed. If decoding succeeded in the ECC decoder 230, the data is output as the reproducing data via the recording decoder 231 and the CRC decoder 232. If the ECC decoding fails, the data is input to the second parity/likelihood correction unit 233. The second parity/likelihood correction unit 233 again performs correction for the block.

In this way, if error correction by the ECC fails, processing in the second parity/likelihood correction unit 233 and ECC decoder 230 is repeated using the likelihood information, whereby the correction capability can be increased.

Since error correction in the ECC decoder 230 may be repeated several times, a high-speed judgment ECC circuit, which will be described in FIG. 9 and later, is used. By this, the calculation volume can be decreased.

According to the this embodiment, the first parity/likelihood correction unit 227 receives the position of each bit of the decoded string and the likelihood thereof from the soft output detector 226, extracts a bit position of which likelihood is low (probability of an error is high) as an error candidate in the unit of the data string to which parity is added, and creates a table.

In other words, a bit position of which probability of an error is high is extracted, so an error candidate, which allows effective correction, can be provided to the ECC decoder 230. Also only a bit position of which probability of an error is high is extracted as an error candidate, so the ECC decoder 230 can decrease the number of times of sorting in the sequence of likelihood, so as to extract an error candidate from the lower likelihood, which is effective to decrease the calculation volume.

Encoder

Now the configuration of the ECC encoder and the parity encoder in FIG. 1 will be described. FIG. 2 is a block diagram depicting the ECC encoder 235 and the parity encoder 234 in FIG. 1, FIG. 3 is a diagram depicting an operation of the interleave section in FIG. 2, FIG. 4 is a diagram depicting an operation of the ECC encoder in FIG. 2, and FIG. 5 to FIG. 7 are diagrams depicting an operation of the parity encoder in FIG. 2.

Figure 2:
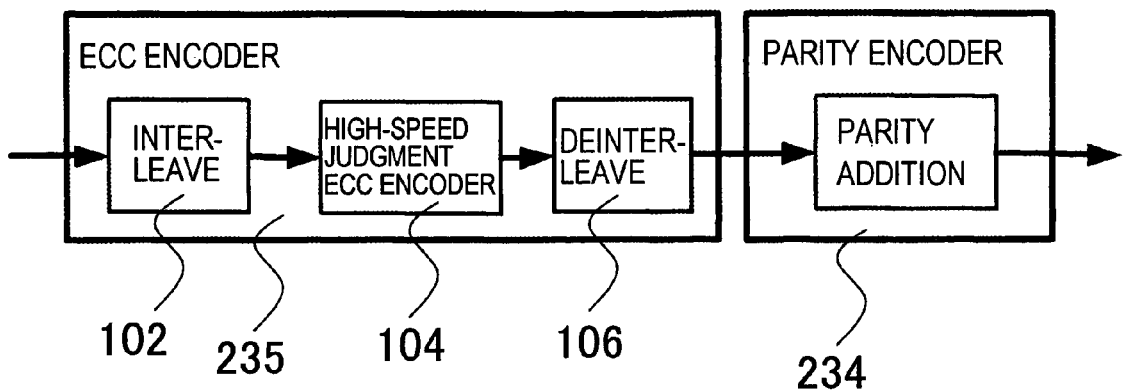
FIG. 2 is a block diagram depicting the encoder in FIG. 1.
Figure 3:
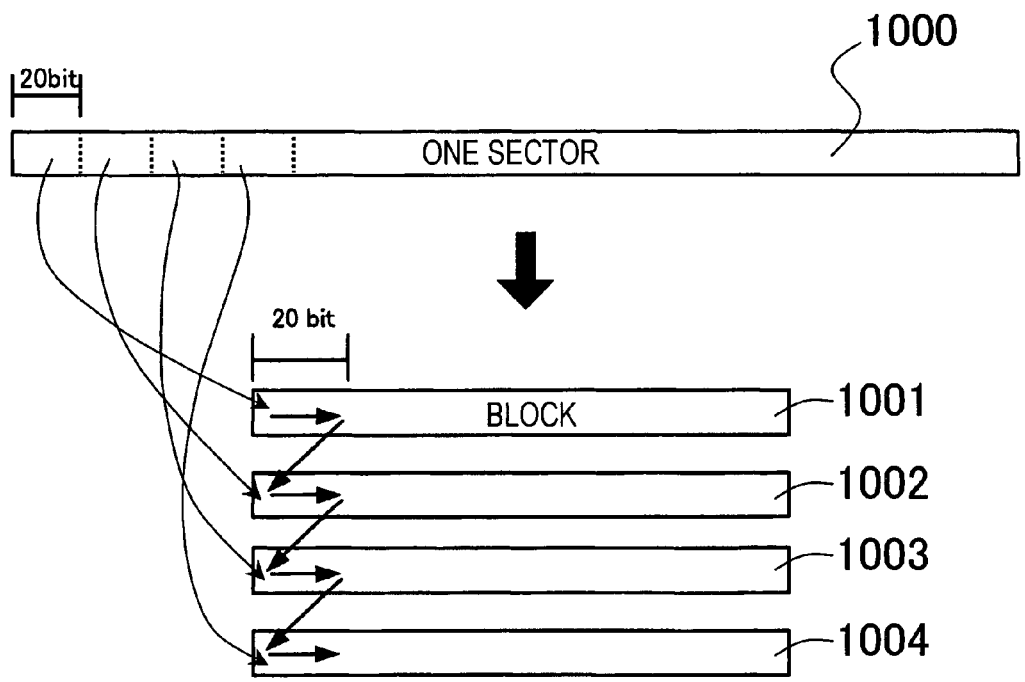
FIG. 3 is a diagram depicting an operation of the interleave section in FIG. 2.

As FIG. 2 shows, the ECC encoder 235 is comprised of an interleave section 102, an ECC encoder 104, and a deinterleave section 106. The interleave section 102 interleaves a data string 1000 with a 4 kbyte sector into four blocks, 1001, 1002, 1003 and 1004, as shown in FIG. 3. When this interleave is performed, the data string 1000 of the sector is interleaved at a 20-bit interval.

Figure 4:
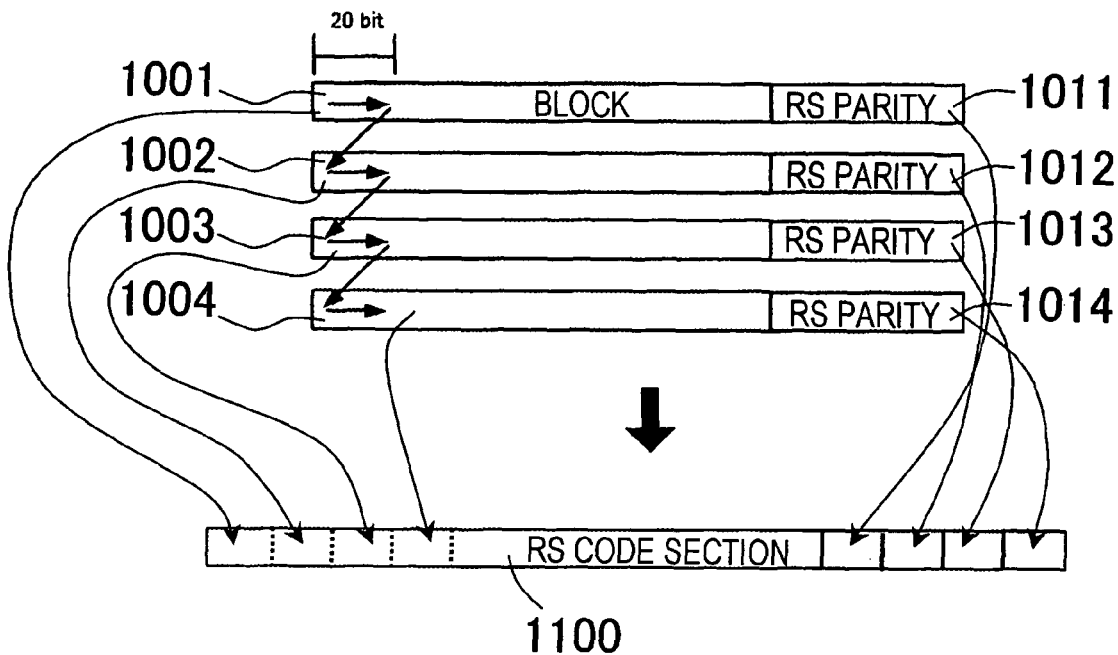
FIG. 4 is a diagram depicting an operation of the ECC encoder in FIG. 2.

The ECC encoder 104 performs ECC encoding for each of the four blocks 1001, 1002, 1003 and 1004, and as FIG. 4 shows, a parity 1011, 1012, 1013 and 1014 of the RS code is added to each block 1001 to 1004 as shown in FIG. 4. It is preferable that the ECC encoder 104 adds a 2t+1 symbols of an RS parity for t symbol corrections, so that the information on failure of decoding can be known when the error locator polynomial is determined.

In other words, a Reed Solomon code generation polynomial of which number of error corrections is t is given by the following Expression (7).

[Expression 7]

$$G(x)=(x-\alpha)\cdot(x-\alpha^2)\ldots(x-\alpha^{2t}) \quad (7)$$

Therefore, in the case of the number of error corrections t=20, a generation polynomial of degree 40, as shown in Expression (8), is used.

[Expression 8]

$$G(x)=(x-\alpha)\cdot(x-\alpha^2)\ldots(x-\alpha^{40}) \quad (8)$$

Whereas in the present embodiment, the degree of the generation polynomial is increased in order to judge the success/failure of decoding sooner in error locator polynomial calculation, and the generation polynomial of degree 41, as shown in Expression (9), is used.

[Expression 9]

$$G(x)=(x-\alpha)\cdot(x-\alpha^2)\ldots(x-\alpha^{40})(x-\alpha^{41}) \quad (9)$$

In other words, 41 symbols of a parity string are generated for ECC encoding, and are inserted in front of one block of a bit string (410 symbols).

The de-interleave section 106 performs deinterleave processing for each block, to which an RS parity is added at a 20-bit interval, as shown in FIG. 4, and converts it into one series of a data string (RS code string).

For example, if 4 kbytes of a sector data string is divided into four, one block is 1 kbyte. If the number of error corrections t is 55 symbols, then a 2t+1 symbols (=111 symbols) of RS parity are added.

Figure 5:
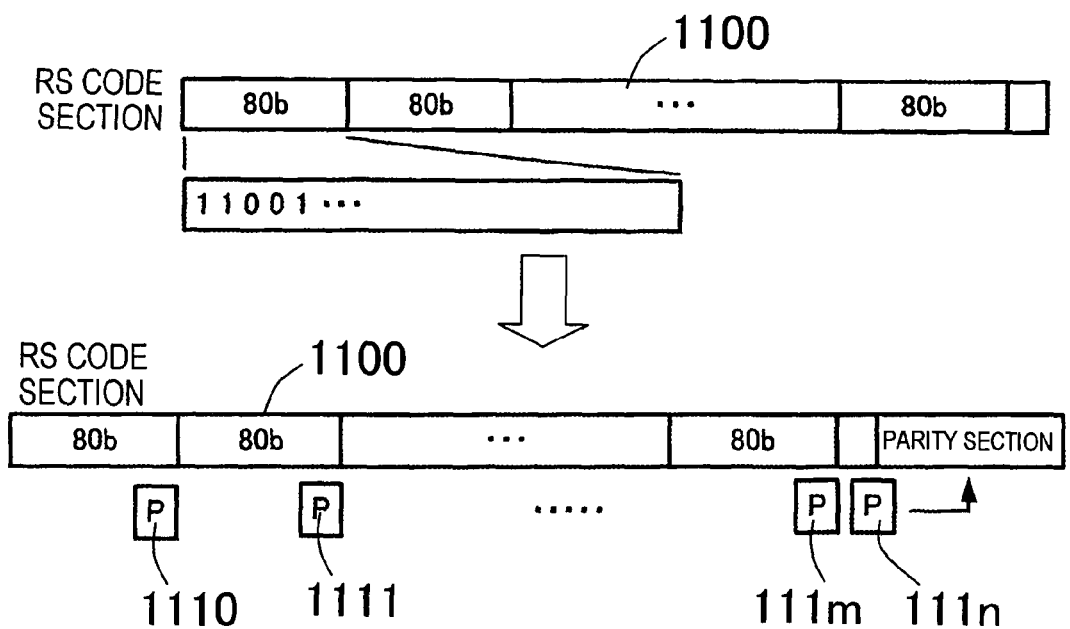
FIG. 5 is a diagram depicting a parity adding operation of the parity encoder in FIG. 2.

Then the parity encoder 234 divides the RS code string 1110 at an 80 bit (=20 bits×4) interval, as shown in FIG. 5. As shown in FIG. 5, 2-bit parity 1110, 1111, ..., 111m, 111n is determined for each divided block (80 bits), and all parities are inserted after the RS code string, and this data is output.

Figures 6, 7:
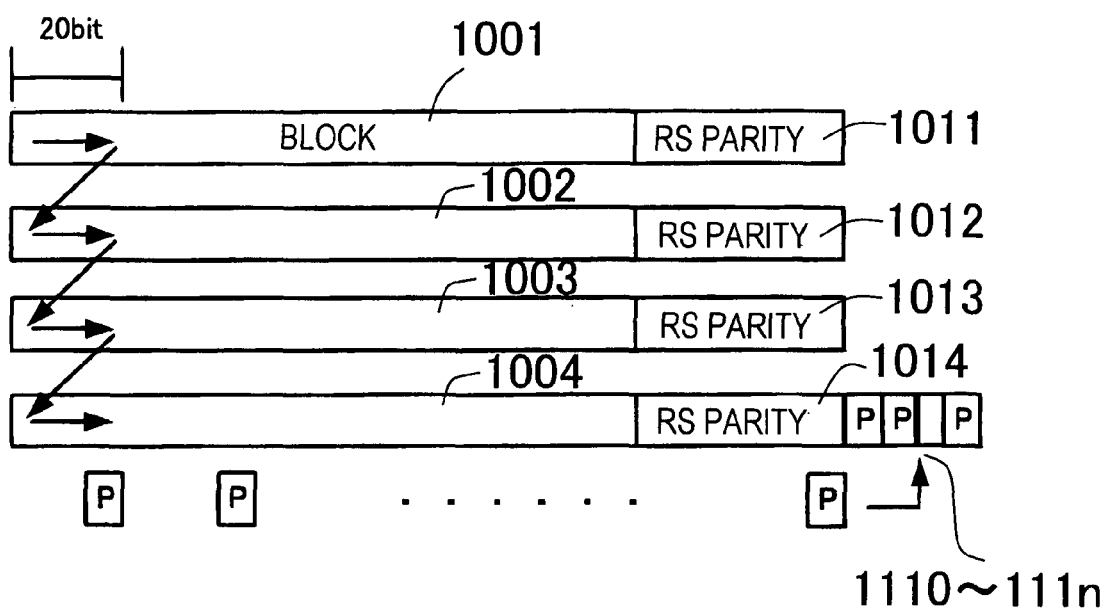
FIG. 6 shows the parity generation expression in FIG. 2.
FIG. 7 is a diagram depicting an output of the parity encoder in FIG. 2.

FIG. 6 shows how to determine a parity of the parity encoder 234. In FIG. 6, an example of determining a parity from the first 80-bit block data in FIG. 5 is shown. As FIG. 6 shows, a remainder when the 80-bit block data "11001 ..." is divided by 3-bit "111" is determined as a parity string. Here the 3-bit "111" indicates the polynomial $(x^2+x+1)$.

FIG. 7 shows a configuration of codes generated by the ECC encoder 235 and the parity encoder 234. To the four blocks 1001, 1002, 1003 and 1004, generated by interleave at a 20-bit interval, RS parities 1011, 1012, 1013 and 1014 are added respectively by the ECC encoder 235.

Also for 20 bits×4 (4 blocks)=80 bits in the vertical direction, 2-bit parity 1110-111n are calculated by the parity encoder 234, and added. Therefore the code generated here is an error correction code based on the RS code in the horizontal direction, and is a concatenation type code consisting of multi-parity (2-bit parity) error detection code.

In this way, the four-division blocks are created by an interleave at a 20-bit interleave, the error correction and detection code constitute a concatenation type code, and an error correction code based on the RS code is used for the horizontal direction of the four-division blocks, and an error detection code based on multi-parity is used for the vertical direction. In terms of the sector data string, the error detection code is set in the horizontal direction at every 80 bit, so that an error can be detected in 80-bit units, and the RS code is set in four 20-bit (¼ of 80 bits) interleave units, so that an error can be corrected in four interleave units.

Because of this, if the ECC decoding fails, a correction position can be locally specified, and gain can be improved. Here a 20-bit unit and 2-bit parity are used considering the balance between encoding efficiency and correction capability, and in the case of 2-bit parity, interleave in 20-bit units is the optimum. Other values can also be used, and if 4-bit parity is used, interleave in 30-bit units is the optimum.

Decoding Device

Figure 8:
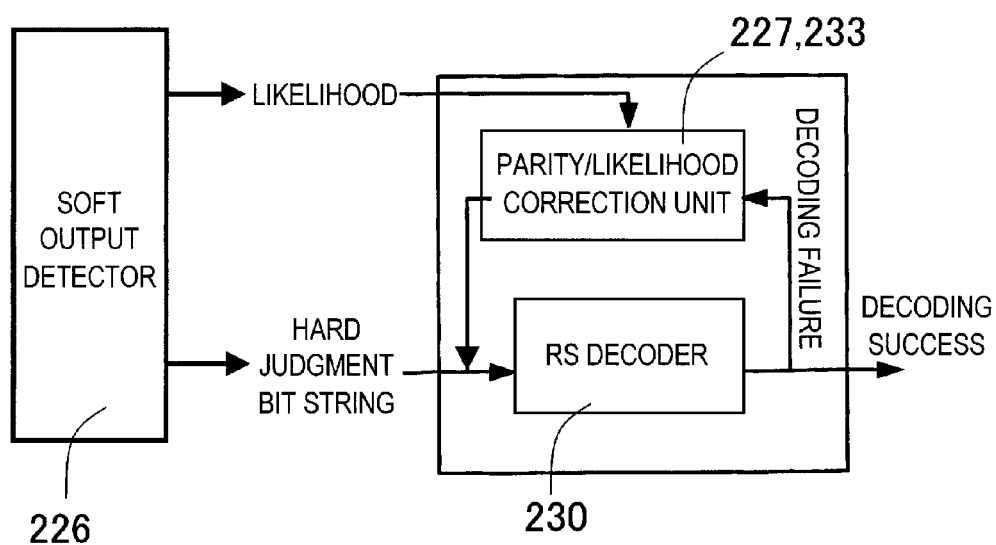
FIG. 8 is a block diagram depicting the decoder in FIG. 1.
Figure 9:
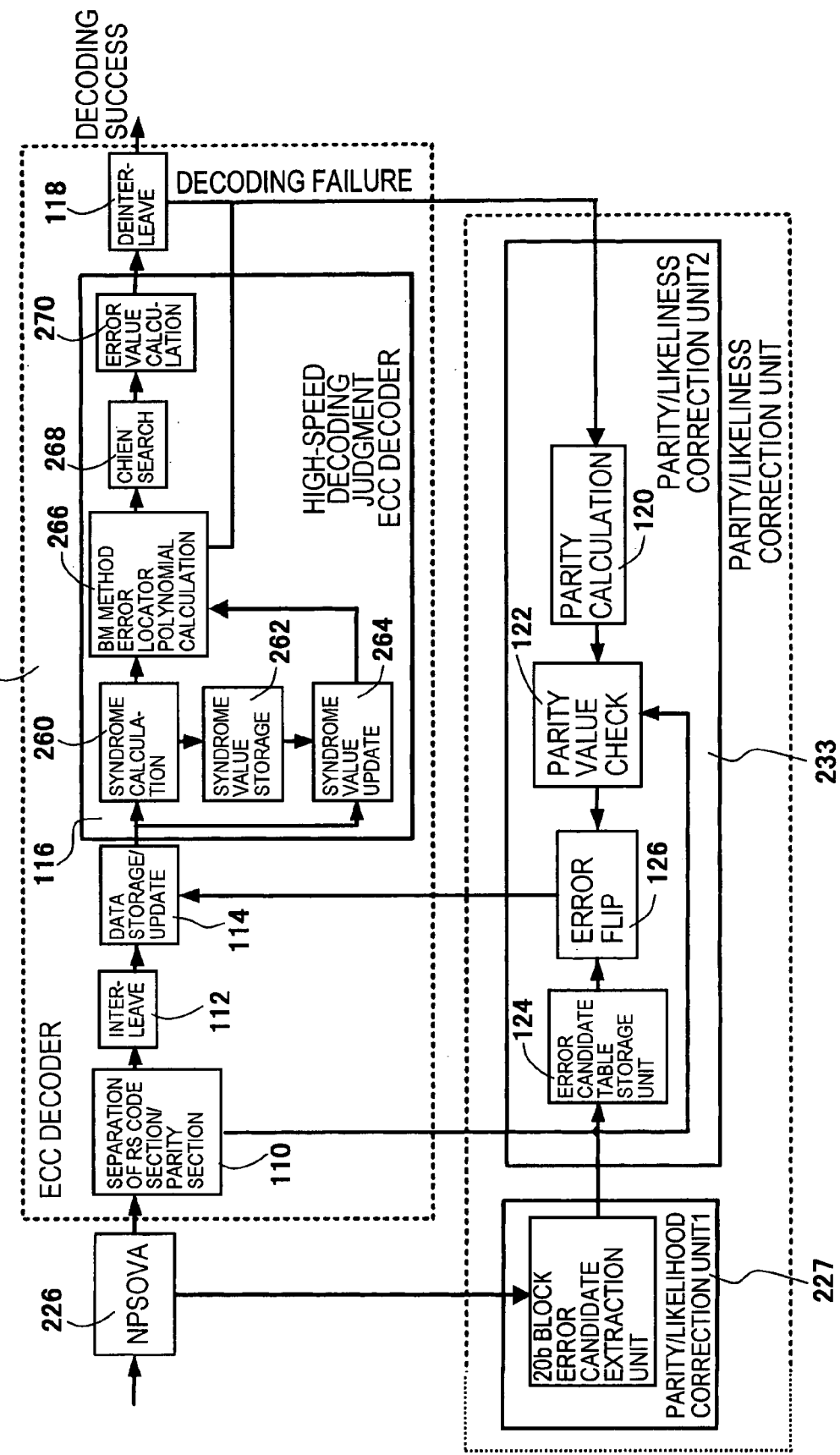
FIG. 9 is a block diagram depicting the details of the decoder in FIG. 8.

FIG. 8 is a block diagram depicting a basic configuration of the decoding device in FIG. 1, and FIG. 9 is a detailed block diagram of FIG. 8.

As FIG. 8 shows, the soft output detector 226 outputs a hard judgment bit string of 0 or 1, and the likelihood of each bit (soft information). As described later, the ECC decoder (RS decoder) 230 receives the hard judgment bit string, performs four-interleave, performs ECC decoding for each block, and outputs the decoded string if decoding succeeds.

As described later, the parity/likelihood correction units 227 and 233 select and store the bit positions of which likelihood is low based on the likelihood from the soft output detector 226, narrows down the error position from the stored bit positions of which likelihood is low when the decoding of the RS decoder 230 fails, flips the position of the bit string, and inputs it to the RS decoder 230. When decoding fails, correction capability is increased by repeating this operation.

This will be described in detail with FIG. 9. The ECC decoder 230 is comprised of an RS code/parity separation section 110, an interleave section 112, a data storage/update section 114, an ECC decoder 116, and a deinterleave section 118.

The ECC decoder 116 is further comprised of a syndrome calculation section 260, a syndrome storage section 262, a syndrome value update section 264 and an error locator polynomial creation section 266, a chien search execution section 268, and an error value calculation section 270.

The syndrome value calculation section 260 calculates a syndrome of a decoded string from the detector 226, and stores the calculated syndrome value in the syndrome value storage section 262. The error locator polynomial creation section 266 calculates an error locator polynomial based on the created syndrome polynomial, and judges whether the result exceeds the correction capability.

The syndrome value update section 264 calculates a syndrome value of an updated portion of the updated bit string by the parity/likelihood correction unit 233, and updates the syndrome value stored in the syndrome value storage unit 262.

If it is judged that decoding does not fail by the error locator polynomial creation section 266, the chien search execution section 268 determines an error position by chien search. If it is not judged that decoding fails in the chien search, that is, if an error position is specified in the chien search, the error value calculation section 270 calculates an error value.

In this way, the previous syndrome value is stored, and if decoding fails, a syndrome value of a corrected portion of the decoded string corrected by the parity/likelihood correction unit 233 is calculated, and the previous syndrome value is updated. Therefore for the corrected bit string, a syndrome value does not have to be calculated from scratch, so the calculation volume can be decreased.

Also as described later, failure of the decoding can be judged in the stage when the error locator polynomial is calculated, so if decoding fails, decoding of the next bit string can be started, therefore the calculation volume can be decreased.

The parity/likelihood correction unit is comprised of the first parity/likelihood correction unit 227 and the second parity/likelihood correction unit 233. The first parity/likelihood correction unit 227 receives a likelihood of each bit from the detector 226, as mentioned later, and extracts a bit position of which likelihood is low, for each block of the four-interleave.

The second parity/likelihood correction unit 233 is comprised of a parity calculation section 120, a parity value check section 122, an error candidate table storage unit 124, and an error flip section 126, as described later.

First Parity/Likelihood Correction Unit

Figure 10:
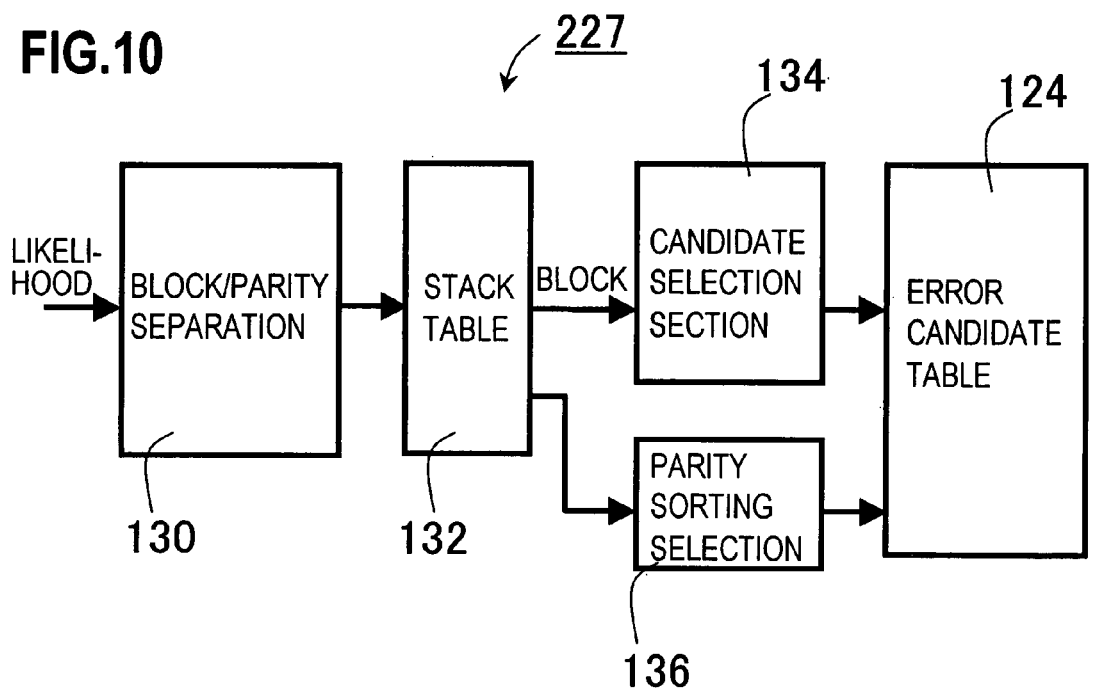
FIG. 10 is a block diagram depicting the first parity/likelihood correction unit in FIG. 9.
Figure 11:
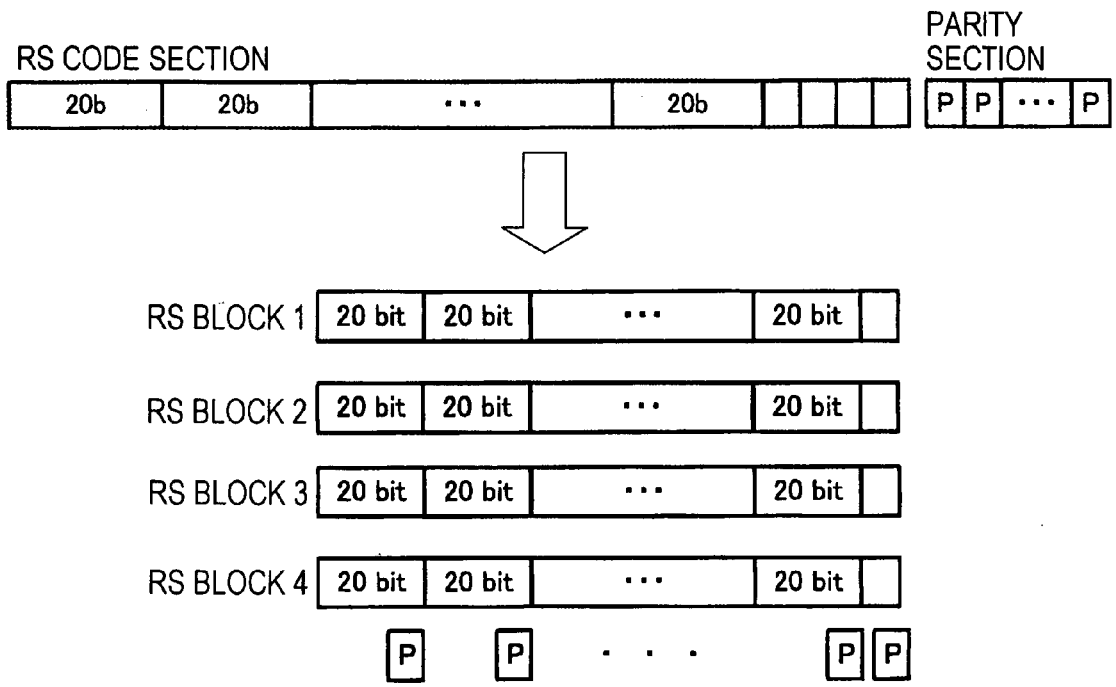
FIG. 11 is a diagram depicting the operation of separating the likelihood of the RS encoding section and the likelihood of the parity section in FIG. 10.

FIG. 10 is a block diagram depicting the first parity/likelihood correction unit 227, FIG. 11 is a diagram depicting an operation of separating the likelihood of the RS code section and likelihood of the parity section in FIG. 10, FIG. 12 is a diagram depicting an operation of the candidate selection section in FIG. 10, FIG. 13 is a diagram depicting an operation of the parity sorting section in FIG. 10, and FIG. 14 is a table showing the error candidate table in FIG. 10.

As FIG. 10 shows, the first parity/likelihood correction unit 227 is comprised of a separation section 130 for separating the likelihood into a likelihood of the block section and a likelihood of the parity section, a stack table 132 for storing the separated likelihood, a candidate extraction section 134 for extracting a bit position of which likelihood is low in the block section, and a parity sorting section 136 for sorting the likelihood of the parity section in the sequence of lower likelihood.

The separation section 130 separates a bit likelihood string to indicate the likelihood of each bit determined by the detector (NPSOVA) in FIG. 9, into the likelihood of a 20-bit block and the likelihood of 2-bit parity, as shown in FIG. 11, and saves them in the stack table 132. Each block created after this separation corresponds to one component (20 bits) when the RS code string is divided in the vertical direction and the horizontal direction as shown in FIG. 11.

The candidate selection section 134 extracts a bit position of which likelihood is low based on the likelihoods of each 20-bit block. As FIG. 12 shows, the likelihood values of a 20-bit block are stored in a corresponding bit position in the stack table 132. As the absolute value of the likelihood becomes higher, this means that this bit has a higher probability of no error, and a lower likelihood indicates that the probability of error is higher for the respective bit. In order to extract bits of which probability of error is high, only bits with low likelihood are handled.

The candidate select section 134 extracts a bit position of which absolute value of the likelihood is smallest, and a bit position of which absolute value of likelihood is second smallest. FIG. 12 shows the status where a bit position "8" of which absolute value of the likelihood is smallest, that is (0.3), bit positions "2" and "3" of which absolute value of the likelihood is second smallest (0.6), and the absolute values "0.3" and "0.6" thereof, are extracted based on the likelihood values of the 20 bits of the stack table 132.

The parity sorting section 136 arranges the bit positions in the sequence of the smaller absolute value of the likelihood based on the likelihood value of the 2-bit parity in the stack table 132, and creates a list as shown in FIG. 13.

FIG. 14 shows the error candidate table 124 in FIG. 10, where the list created by the select section 134 and the sorting section 136 is stored according to the vertical direction of FIG. 11. The table 124 shown in FIG. 14 is a table of bit positions of which error probability is high in the 20×4=80 bit block. In the error candidate table 124, a table of bit positions of which error probability is high is created in each 80-bit block, and the result is output to the second parity/likelihood correction unit 233.

A continuous bit string where the absolute value of likelihood is the same is stored in a same row, as shown in FIG. 14, and this bit string becomes one error candidate.

Using such higher error candidates of the error candidate storage unit 124, the ECC decoder 230, which will be described below, efficiently corrects errors.

ECC Decoder

Figure 15:
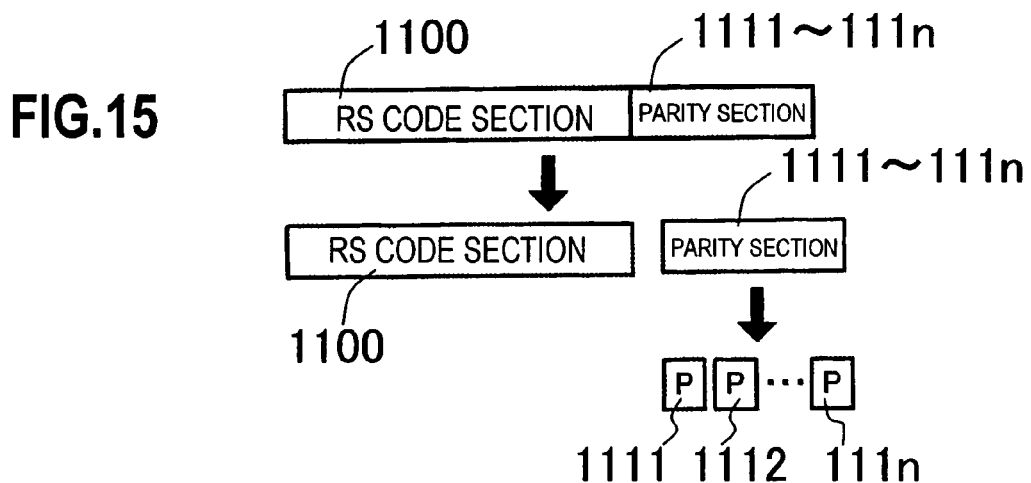
FIG. 15 is a diagram depicting a separation operation of the ECC decoder in FIG. 9.
Figure 16:
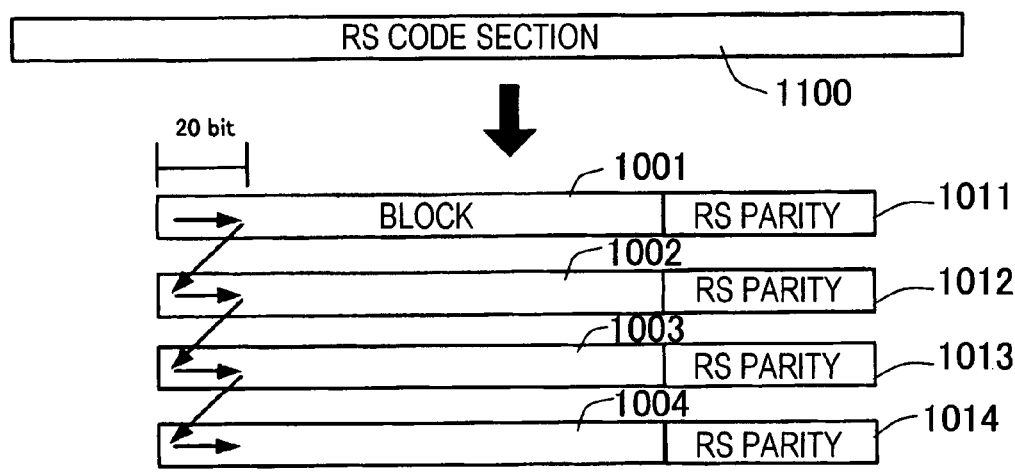
FIG. 16 is a diagram depicting the interleave operation in FIG. 9.
Figure 17:
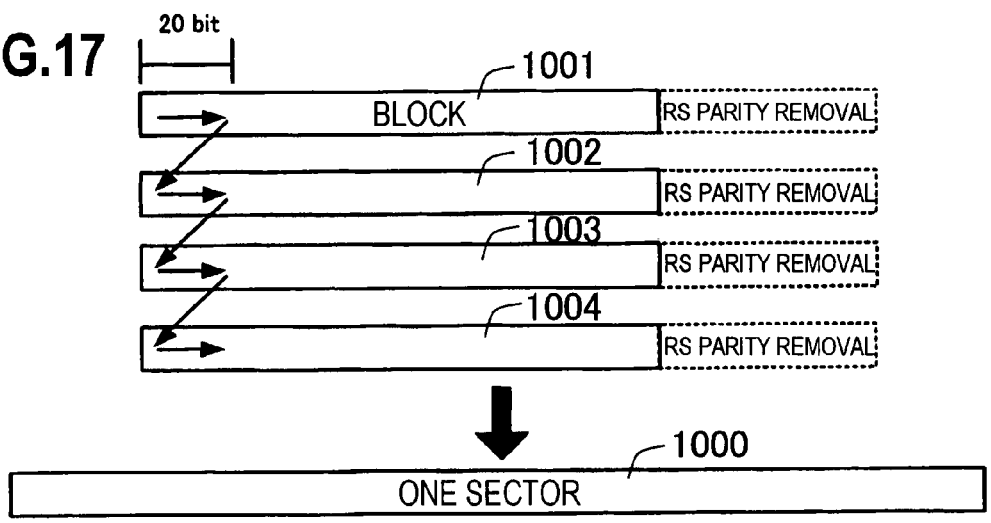
FIG. 17 is a diagram depicting the de-interleave operation in FIG. 9 when decoding succeeded.
Figure 18:
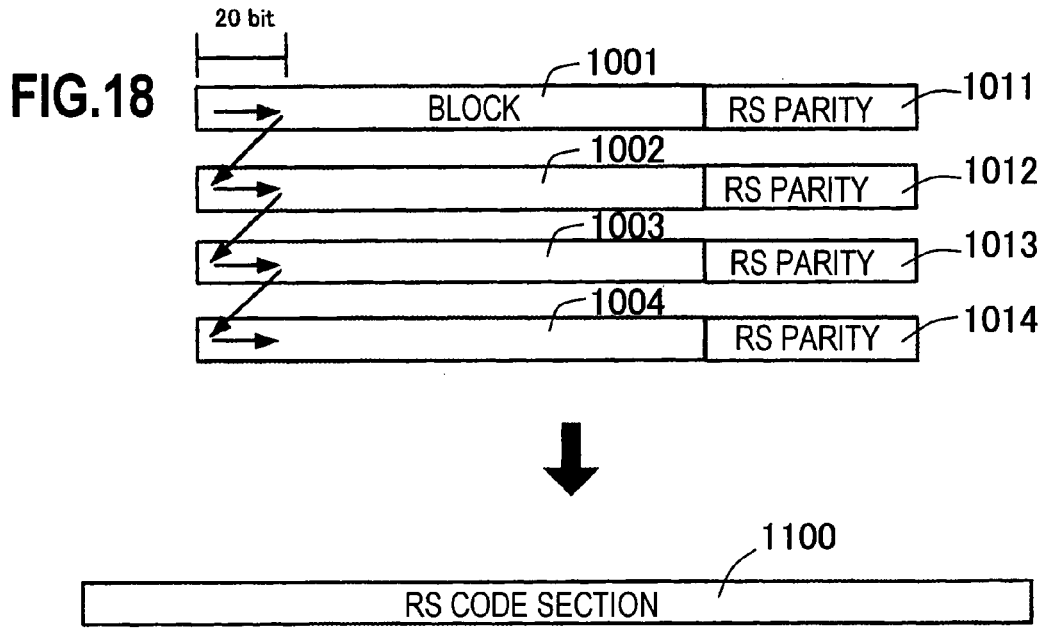
FIG. 18 is a diagram depicting the de-interleave operation in FIG. 9 when decoding fails.

FIG. 15 is a diagram depicting the separation operation of the ECC decoder in FIG. 9, FIG. 16 is a diagram depicting the interleave operation in FIG. 9, FIG. 17 is a diagram depicting the deinterleave operation in FIG. 9 when decoding succeeded, and FIG. 18 is a diagram depicting the deinterleave operation in FIG. 9 when decoding fails.

The operation of the ECC decoder 230 in FIG. 9 will be described with reference to FIG. 15 to FIG. 18. As FIG. 9 shows, the result, when the likelihood value of the detector (NPSOVA) 226 is hard-judged to a value "0" or "1", is substituted in the ECC decoder 230.

In the ECC decoder 230, the separation section 110 separates the hard-judged bit string into the RS code section 1100 and the 2-bit parity sections 1111 to 111n, as shown in FIG. 15. All the separated 2-bit parity 1111 to 111n are output to the parity value check section 122 of the second parity/likelihood correction unit 233.

Then the interleave section 112 interleaves the separated RS code section 1100 at a 20-bit interval, as shown in FIG. 16, into four RS blocks 1001, 1011-1004, and 1014. In other words, reverse processing of deinterleave of the encoding in FIG. 4 is performed.

Each RS block after separation is stored in the data storage/update section 114, and is then decoded by the ECC decoder 116. If decoding of all the RS blocks succeeded as a result of decoding, the deinterleave section 118 removes the RS parities 1011 to 1014 from each RS block, as shown in FIG. 17, then performs deinterleave processing at a 20-bit interval, outputs the sector data 1000, and ends the processing.

If decoding fails in a plurality of RS blocks as a result of decoding, the ECC decoder 230 outputs the RS block numbers of all the RS blocks in which decoding fails to the second parity/likelihood correction unit 233. The deinterleave section 118 performs deinterleave processing at a 20-bit interval without removing the RS parities 1011 to 1014 from each RS block 1001 to 1014, as shown in FIG. 18, and outputs the result, that is the original RS code section 1100, to the second parity/likelihood correction unit 233.

Now the ECC decoder 116 will be described. The syndrome calculation section 260 calculates the syndrome polynomial (coefficient of polynomial s1, s2, ...) of the data string according to Expression (3), and outputs the calculated syndrome polynomial to the error locator polynomial calculation section 266. At this time, the values of (2t+1) number of syndrome coefficients si (i=1, 2, ... 2t, 2t+1) are calculated. At the same time, the syndrome calculation section 260 stores the calculated syndrome polynomial to the syndrome value storage section 262 so as to use it for the second or later decoding processing of the candidates.

The error locator polynomial calculation section 266 calculates the syndrome polynomial by the Berlekamp Massey (BM) method. In the Berlekamp Massey method, an update of the polynomial is started with the initial value of the polynomial, and is repeated for the same number of times as the degree of the generation polynomial, so as to calculate the error locator polynomial. In order to determine the i-th polynomial Ci (x), the value of the i-th syndrome si is required.

The error locator polynomial calculation section 266 generates the 2t-th polynomial C2t(x) and the (2t+1)th polynomial C2t+1(x). Then the error locator polynomial calculation section 266 compares the coefficients 2t-th polynomial C2t (x) and the (2t+1)th polynomial C2t+1(x), and judges whether the two polynomials match.

According to the Berlekamp Massey method, if the number of errors included in a data string is k (k≦t), the polynomial is not updated in the (2k+1)th or later repeat, and C2k(x) and later polynomials all become the same. Therefore if C2t(x) and C2t+1(x) match, then the number of errors is at most t, and the errors are within the range of error correction capability. If C2t(x) and C2t+1(x) do not match, on the other hand, this means that the errors exceed the error correction capability.

As a consequence, if C2t(x) and C2t+1(x) match, this is judged that correction of this candidate will succeed, and the data string, syndrome polynomial, error locator polynomial and judgment result are output to the chien search execution section 268. If C2t(x) and C2t+1(x) are different, this is judged that correction of the candidate fails, and a decoding failure flag is set for the RS block currently being decoded, and this block number of the second parity/likelihood correction unit 233 is output.

In this way, by calculating one more polynomial of the Berlekamp Massey method by adding one symbol of an extra parity to the data string, a correction failure of the data string can be detected in the middle of decoding. A format of adding several symbols of extra parity may be used.

If it is judged that decoding does not fail, an error position is determined by chien search. In other words, the chien search execution section 268 executes a chien search using the error locator polynomial C(x), and calculates the value of $C(\alpha^j)$ (j=0, 1, 2, 3, 4, ... n) for all positions j on the data string. The position j where $C(\alpha^j)$=0 is the error position.

The chien search execution section 268 also judges the success/failure of correction using the syndrome polynomial and the value of $C(\alpha^j)$, and if it is judged that correction will succeed, the chien search execution section 268 outputs the received data string, syndrome polynomial, and error locator polynomial to the error value calculation section 270. If it is judged that correction will fail, the decoding failure flag is set for the RS block currently being decoded, and this block number of the second parity/likelihood correction unit 233 is output.

If an error position is specified in a chien search, the error value is calculated. In other words, the error value calculation section 270 corrects the incorrect value at the error position of the data string to the correct value by a predetermined algorithm using the syndrome polynomial and error locator polynomial. Then the error value calculation section 270 outputs the data string after correction to the deinterleave section 118.

In other words, if decoding succeeds, the error-corrected data string is output from the ECC decoder 230. If correction fails and a second or later decoding is required, the decoding processing is performed using the information stored in the syndrome value storage section 262.

Then, as described later, the data of the data update/storage section 114 is updated and stored by flipping the error location with the second parity/likelihood correction unit 232. For this updated RS block, the syndrome value update section 264 calculates the syndrome corresponding to the data updated location, updates the syndrome value stored in the storage section 262, and outputs the updated syndrome polynomial to the error locator polynomial calculation section 266.

Hereafter, as described above, the error locator polynomial calculation section 266 creates an error locator polynomial, and if it is judged that decoding fails, the decoding failure flag is set for the current RS block and this information is output to the second parity/likelihood correction unit 232. If it is judged that decoding does not fail, the chien search execution section 268 determines the error position. If it is judged that decoding fails in the chien search, the decoding failure flag is set for the current RS block, and this information is output to the second parity/likelihood correction unit 232. If an error position is specified in a chien search, the error value is calculated.

As described above, it is unnecessary to calculate the syndrome value from scratch for the flipped bit string, so the calculation volume can be decreased. Also a failure in decoding can be judged in a stage where the error locator polynomial is calculated, so if decoding fails, the next processing can be executed, and the calculation volume can be decreased.

Therefore the ECC decoder 116 can decrease the calculation volume and perform faster decoding compared with the conventional ECC decoder.

Second Parity/Likelihood Correction Unit

Figure 19:
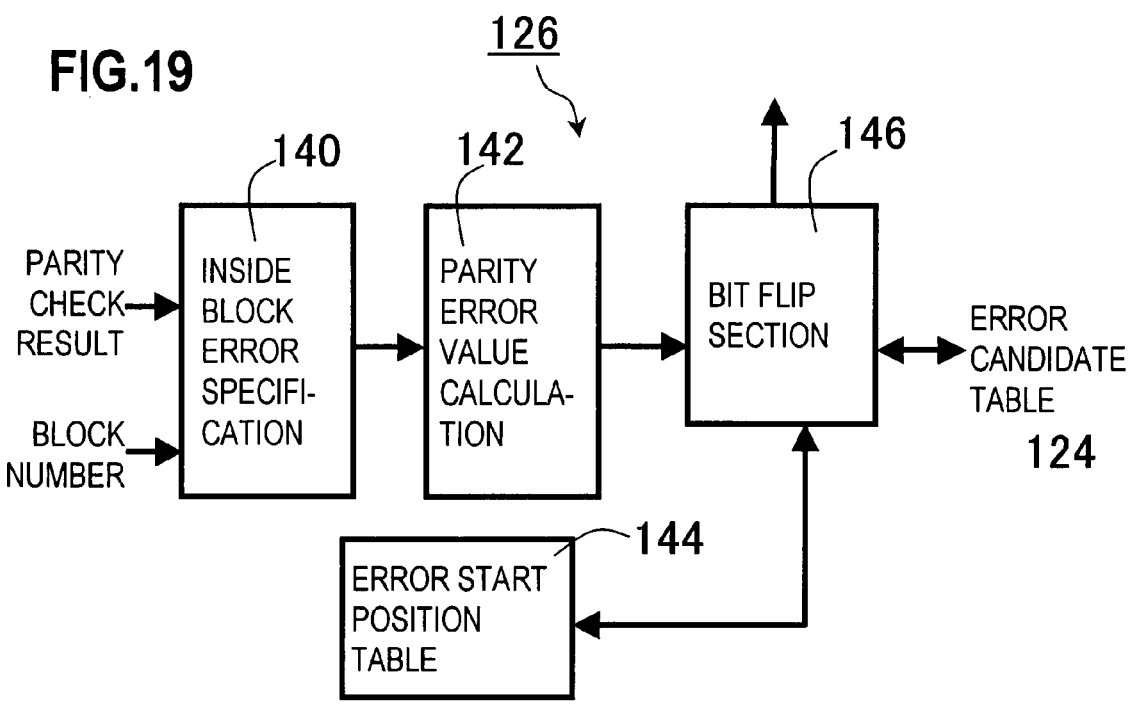
FIG. 19 is a block diagram depicting a bit flip section of the second parity/likelihood correction unit in FIG. 9.
Figures 23, 24:
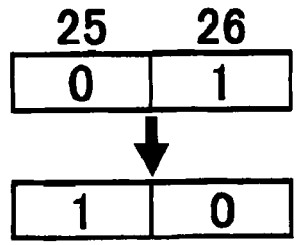
FIG. 23 shows the error generation position correspondence tables in FIG. 19.
FIG. 24 is a diagram depicting the bit flip operation in FIG. 19.

FIG. 19 is a block diagram depicting an error flip section 126 of the second parity/likelihood correction unit, FIG. 20 is a diagram depicting an error position specifying operation by the parity check in FIG. 9, FIG. 21 is a diagram depicting a parity error value in FIG. 19, FIG. 22 is a diagram depicting a definition of a position number of the parity block in FIG. 19, FIG. 23 shows an error generation position correspondence table, and FIG. 24 is a diagram depicting the bit flip operation in FIG. 19.

After all the RS block numbers of the RS blocks in which decoding fails and the RS code section 1100 (see FIG. 18) where deinterleave processing is performed, are input to the second parity/likelihood correction unit 233, a parity is determined in the same way as the second parity encoder in FIG. 2.

In other words, the parity calculation section 120 in FIG. 9 divides the RS code section 1100 at n 80-bit interval as shown in FIG. 5, and 2 bits of parity is recalculated for each divided block, as shown in FIG. 5 and FIG. 6.

The parity value check section 122 performs the parity value check, determining whether the parity value generated by the parity encoder received from the separation section 110 and the recalculated parity value match. FIG. 20 shows the status of the parity check. In the example in FIG. 20, the parity values in the first parity block string have different values.

A parity block string of which value matches in the parity check is judged as no error, and a parity block string of which value does not match is judged as an error. In this case, the first parity block string is judged as an error.

As FIG. 19 shows, the error flip section 126 in FIG. 9 is comprised of an inside block error specifying section 140 for narrowing down the error position inside the block based on the parity check result and the decoding failure block number, a parity error calculation section 142 for calculating a parity error value, an error start position table 144 for storing an error start position to be described in FIG. 23, and a bit flip section 146 for specifying an error position by referring to a table 144 by the parity error value, and inverting the bit value at the error position.

As an example in FIG. 20 shows, in the RS block string, decoding of the second RS block 1002 fails, and decoding of the other RS blocks 1001, 1003 and 1004 succeeded. The inside block error specifying section 140 judges that the RS blocks of which decoding succeeded do not have an error, and judges that an error exists in the RS block 1002 of which decoding fails. In the case of this example, it is judged that an error exists in the second RS block 1002.

So the inside block error specifying section 140 determines that an error exists in the first parity block string and second RS block 1002. In other words, it is determined that the area in grey shown in FIG. 20 has an error. In this way, an area having an error can be narrowed down to a common portion of a parity block string of which parity value does not match, and a common portion with the RS block string of which decoding fails.

In FIG. 20, it was determined that the 20-bit block in the gray area has an error, and this error position is further narrowed down. For this, the parity values are focused on. As FIG. 21 shows, the parity error calculation section 142 adds the parity value generated by the parity encoder and the recalculated parity value, and regards the result as the parity error value.

When the position numbers of the parity blocks are defined as shown in FIG. 22, the relationship for narrowing down the error generation position using the parity error value (table), as shown in FIG. 23, is created. In other words, according to the parity creation rule described in FIG. 6, the 80-bit data string is divided by 3 bits "111", and the remainder 2 bits is regarded as parity. In the case of 2-bit parity, the parity error value, where parity does not match, are three: "01", "10" and "11".

If the error start position is determined for a 1-bit error and a 2-bit error in these three cases, different start positions at multiples of 3 are acquired as shown in FIG. 23. Therefore the error generation position can be narrowed down based on the parity error value. In the case of this example, the parity error value is "10", as shown in FIG. 21, so if a 1-bit error occurs, the error is at one of the position numbers 0, 3, 6, . . . in FIG. 22, and cannot be at any other position, as shown in FIG. 23.

If a 2-bit error occurs, the error is at one of the position numbers 1, 2, 4, 5, 7, 8 . . . in FIG. 22, and cannot be at any other position. In this narrowing down of the error position based on the parity error value, all errors other than a multiple of a 3-bit error can be narrowed down.

The bit flip section 146 refers to the error start position table in FIG. 23 by the parity error value, and determines the 1-bit error start position and the 2-bit error start position. Then the bit flip section 146 specifies an error position based on the error candidate table 124 and the error start position determined by the parity error value, and flips the bit at the error position.

For example, it is assumed that the content of the error candidate table 124 of the parity block string is as shown in FIG. 14. In order to correspond the position information of FIG. 14 and FIG. 22, the position j in FIG. 14 is corresponded to the position 20 (i−1)+j in FIG. 22 for the 20-bit block number i (i=1, 2, 3, 4).

In the case of the example in FIG. 20, an error does not exist in an area other than the gray area, so 20-bit block numbers 1, 3 and 4 need not be used. In the error candidate table 124 in FIG. 14, it is the highest probability that a 1-bit error occurred to the second position of the 20-bit block 2, that is the $22^{nd}$ position in FIG. 22.

FIG. 23, however, shows that a 1-bit error does not occur at the $22^{nd}$ position if the parity error value is "10". So the bit flip section 146 judges that the candidate indicated in the error candidate table 124 is incorrect, and judges that a 2-bit error occurred at the $25^{th}$ and $26^{th}$ positions which have the second highest probability that an error occurred (positions 5 and 6 of which likelihoods are 0.5 in FIG. 14).

FIG. 23 as well shows that the generation of a 2-bit error is possible at the $25^{th}$ and $26^{th}$ position if the parity error value is "10". Therefore the bit flip section 146 judges that a 2-bit error occurred to the $25^{th}$ and $26^{th}$ position, and flips (inverts) the values of the $25^{th}$ and $26^{th}$ bits as shown in FIG. 24.

The same processing is performed for the other parity block strings where an error exists, the data on the second RS block of which error is flipped is updated in the storage unit 114, and the error is corrected in the ECC decoder 116. In the case of the second and later error correction, only the RS block of which decoding fails the first time is corrected, and correction for all the RS blocks is unnecessary.

In the error candidate table 124 in FIG. 14, it may be indicated that the error probability is highest (likelihood is lowest) in the parity bit. In this case, the bit flip section 146 flips a bit of the parity value indicated in the table 124, and judges whether the flipped parity value becomes the same as the recalculated parity value. And if the same, the bit flip section 146 judges that the bit of the parity has an error, and flips the bit of the parity. In this case, correction of the RS block is not performed.

Decoding may fail in a plurality of RS blocks. In such a case, a candidate of which error probability is highest and a candidate of which error probability is second highest are extracted from the error candidate table 124 in FIG. 14 for all of the 20-bit blocks corresponding to the blocks of which decoding of an RS block fails. Then these candidates are compared with the start position in FIG. 23, and the candidate to be flipped are selected. If both the first and second candidates do not match the start positions in FIG. 23, then it is judged that there are no candidates, and the processing ends without performing a flip operation.

Since the error positions can be narrowed down in this way, it was confirmed that ECC of the present invention has a performance that exceeds one-interleave ECC.

Also by combining with the ECC decoder 116 in FIG. 9, the speed of judgment of correctability and the syndrome creation for the decoding target data string of the ECC decoder can be increased, and decoding with less calculation volume becomes possible.

Other Encoders

The above mentioned parity encoder 234 in FIG. 2 separates the RS code string 1100 at an 80-bit (=20 bits×4) interval, as shown in FIG. 5, 2-bit parities 1110, 1111, ..., 111m, 111n, are determined for each separated block (80 bits), and all parities are inserted after the RS code string and this data are output.

Then 4-division blocks are created by an interleave at a 20-bit interleave, as shown in FIG. 7, the error correction and detection code constitute a link type code, and an error correction code based on the RS code is used for the horizontal direction of the 4-division blocks; and an error detection code based on multi-parity is used for the vertical direction.

Figure 25:
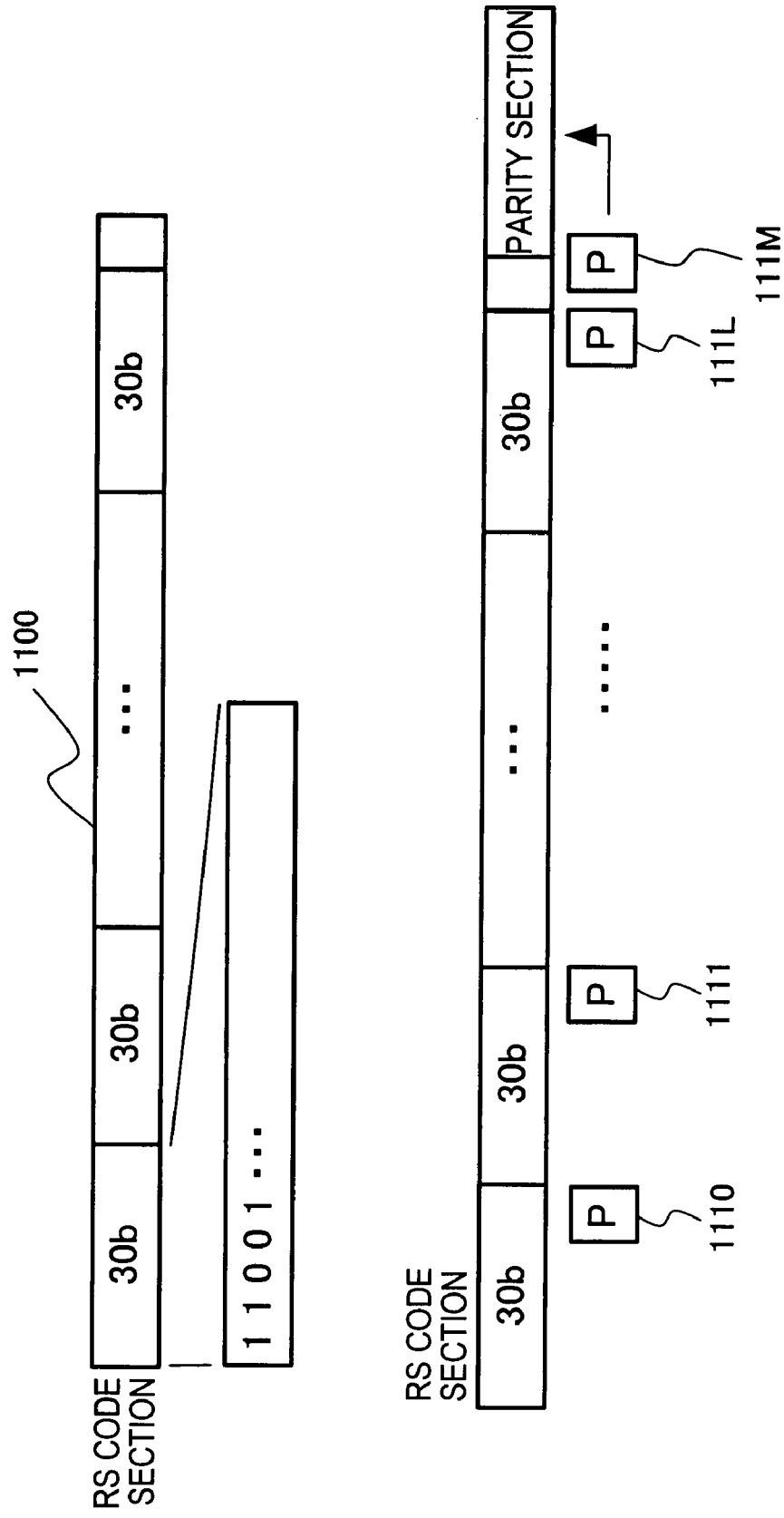
FIG. 25 is a diagram depicting a parity adding method according to another embodiment of the present invention.

However other division methods for the vertical direction can also be used. FIG. 25 is a diagram depicting another parity addition method of the present invention, and FIG. 26 is a diagram depicting a configuration of a code generated by the parity encoder 234 using the addition method in FIG. 25.

As FIG. 25 shows, the RS code string 1100 is separated at an arbitrary interval, such as 30 bits, and parities 1110, 1111, ... are added. In FIG. 5, a parity is added at an 80-bit interval in 4-division units, but this is not limited to 80 bits (m×n bits), and a parity may be added at an interval of another number of bits.

Figure 26:
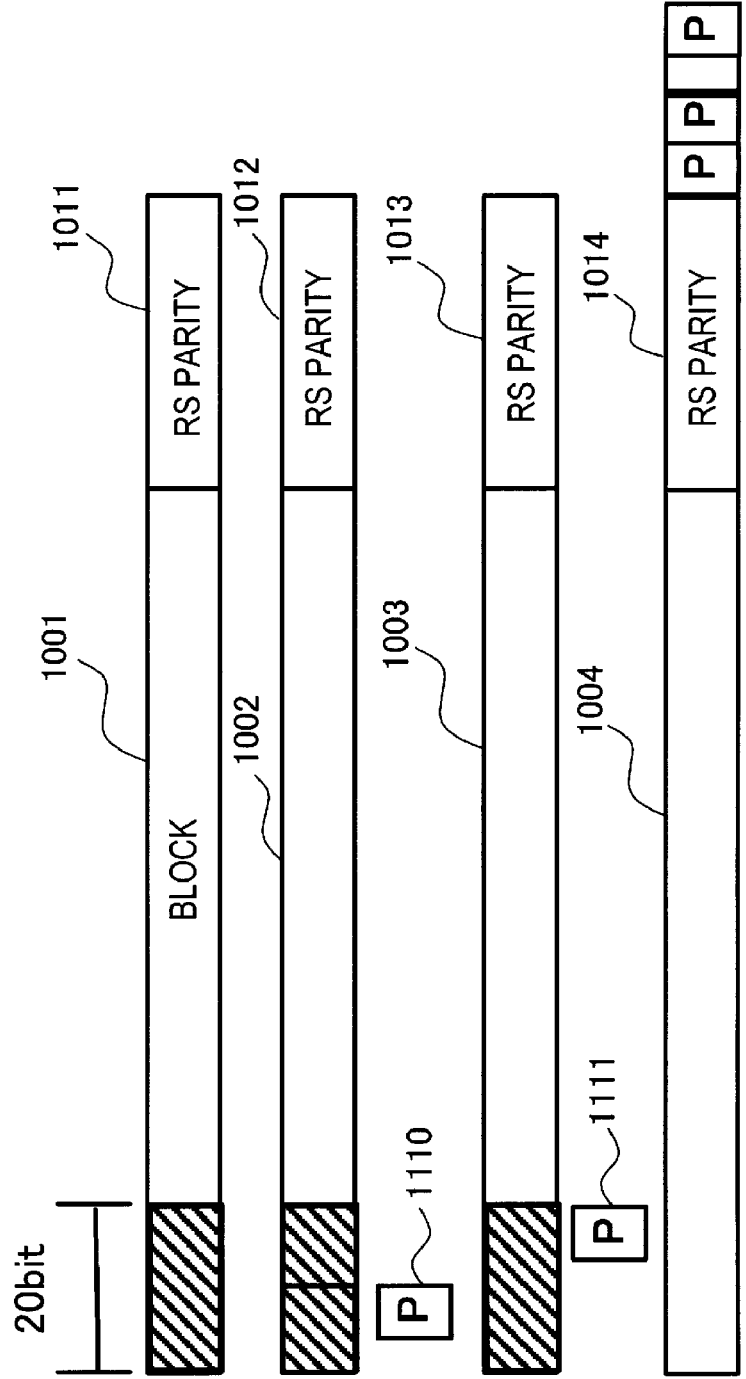
FIG. 26 is a diagram depicting a relationship of a parity bit in FIG. 25 and the RS code block.

In the case of FIG. 25, a code generated by the parity encoder 234 is comprised of two RS code strings, 1001 and 1002, between which a parity is inserted, as shown in FIG. 26. Between the two RS code strings 1002 and 1003, a parity is inserted at a 20-bit interval.

Figure 27:
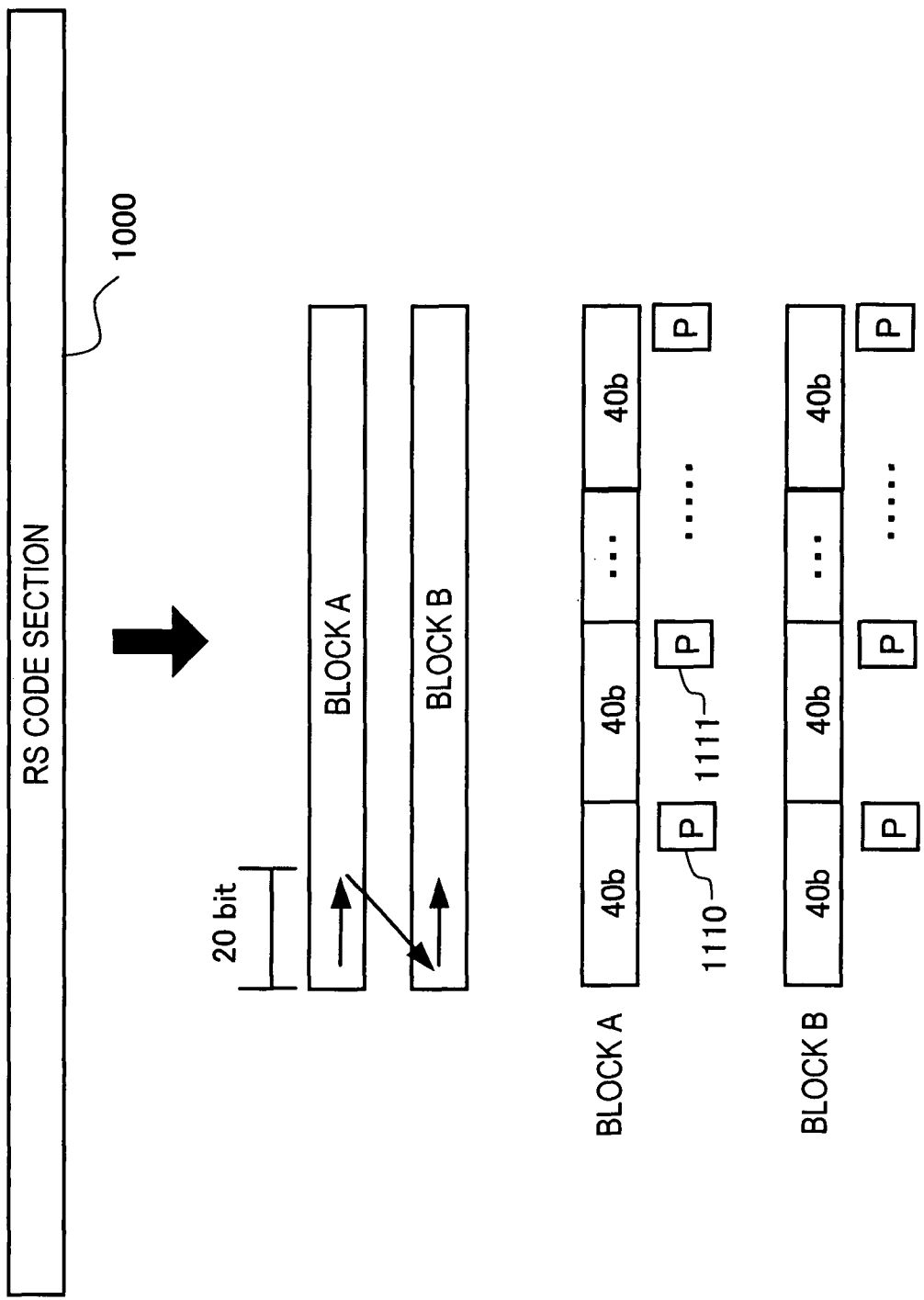
FIG. 27 is a diagram depicting a parity adding method according to still another embodiment of the present invention.
Figure 28:
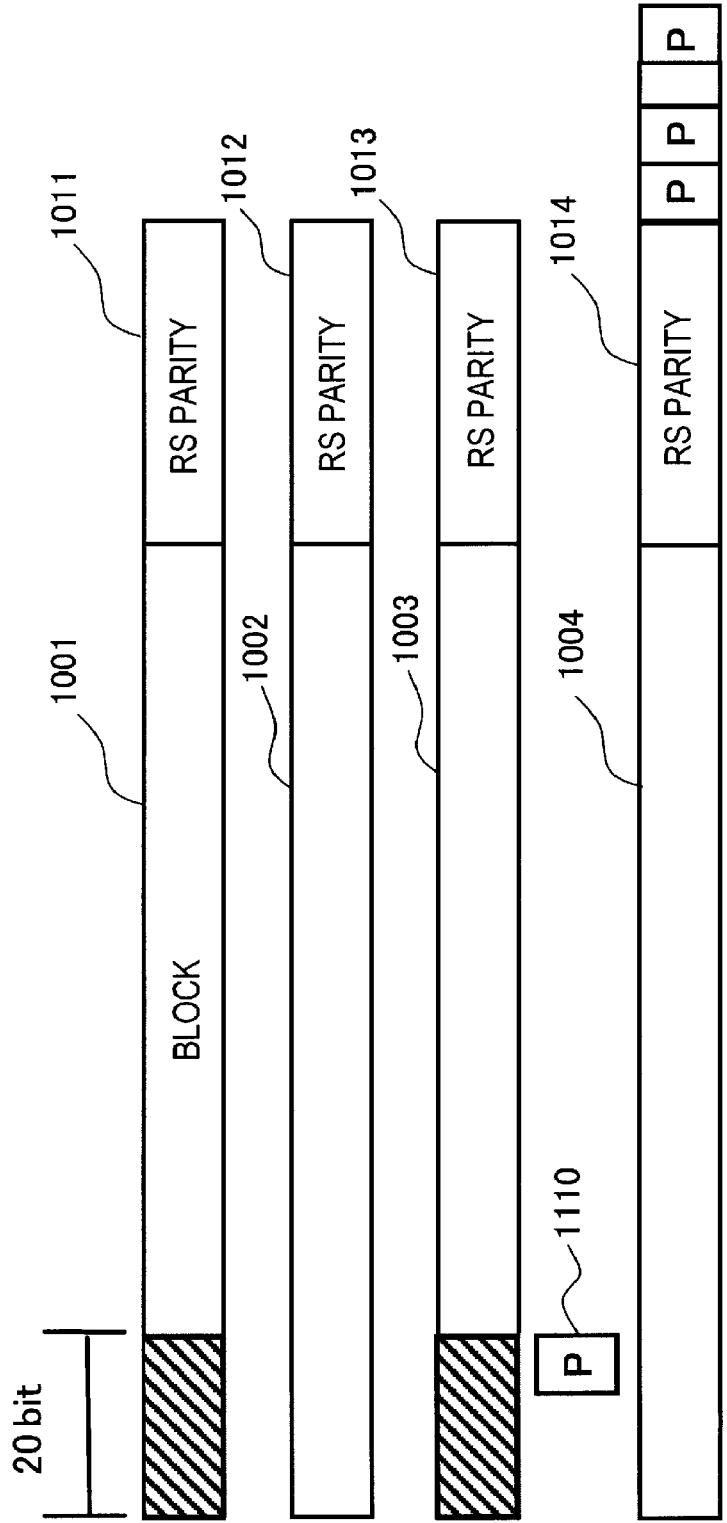
FIG. 28 is a diagram depicting a relationship of the parity in FIG. 27 and the RS code block.

FIG. 27 is a diagram depicting still another parity addition method, and FIG. 28 is a diagram depicting a configuration of a code generated by the parity encoder 234 using the addition method in FIG. 27.

As FIG. 27 shows, interleave is performed on the RS code string 1100 at a 20-bit interval, so as to create two blocks, A and B. Each block A and B is separated at a 40-bit interval, and parities 1110, 1111, ... are created at a 40-bit interval for these blocks. In this case, a code generated by the parity encoder 234 has separate RS blocks 1001 and 1013 to which a parity 1110 is added, as shown in FIG. 28.

In this way, a parity may be created between blocks which are separated at a 20-bit interval by interleave.

In FIG. 6, when a parity encoder 234 determines a parity, the remainder, when 80-bit block data "11001 ..." is divided by a 3-bit "111", is determined as a parity string. Here the three bits "111" indicates the polynomial (x2+x+1).

Figure 29:
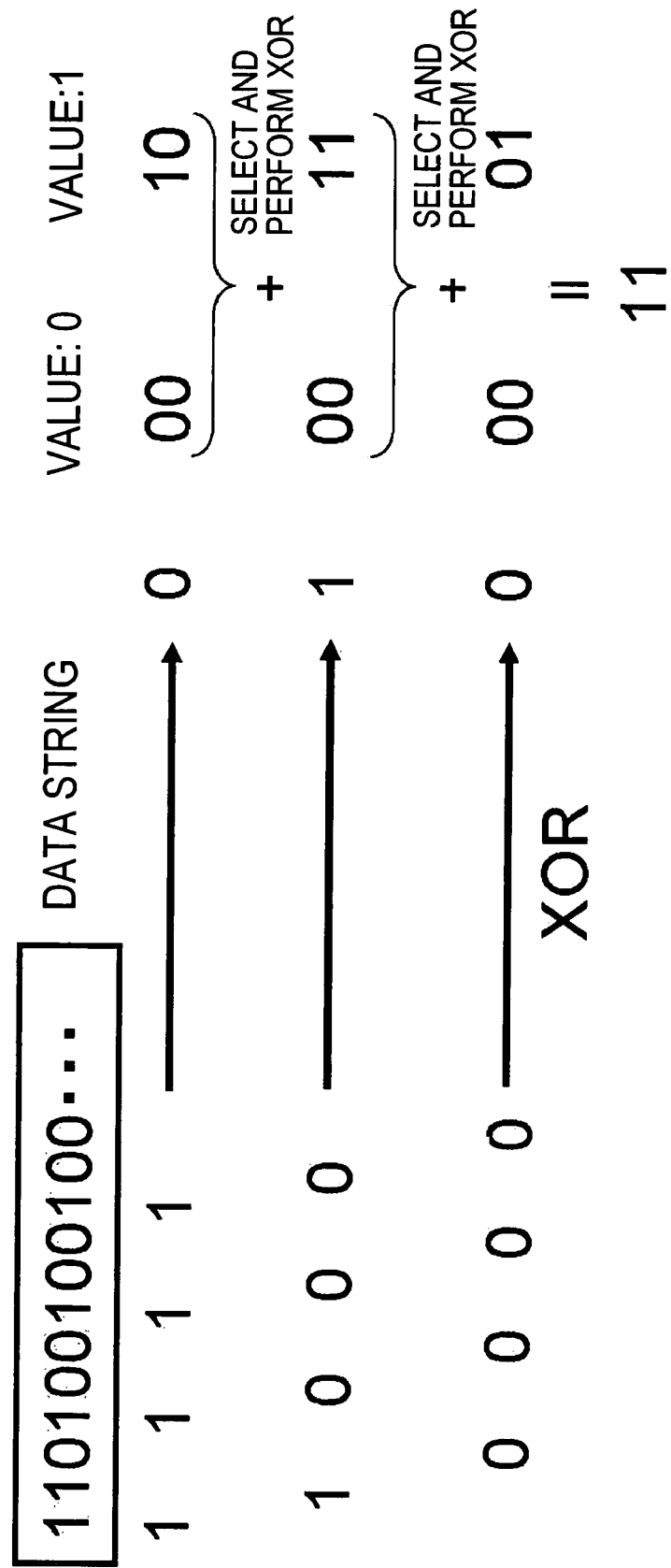
FIG. 29 is a diagram depicting a parity addition unit according to still another embodiment of the present invention.
Figure 30:
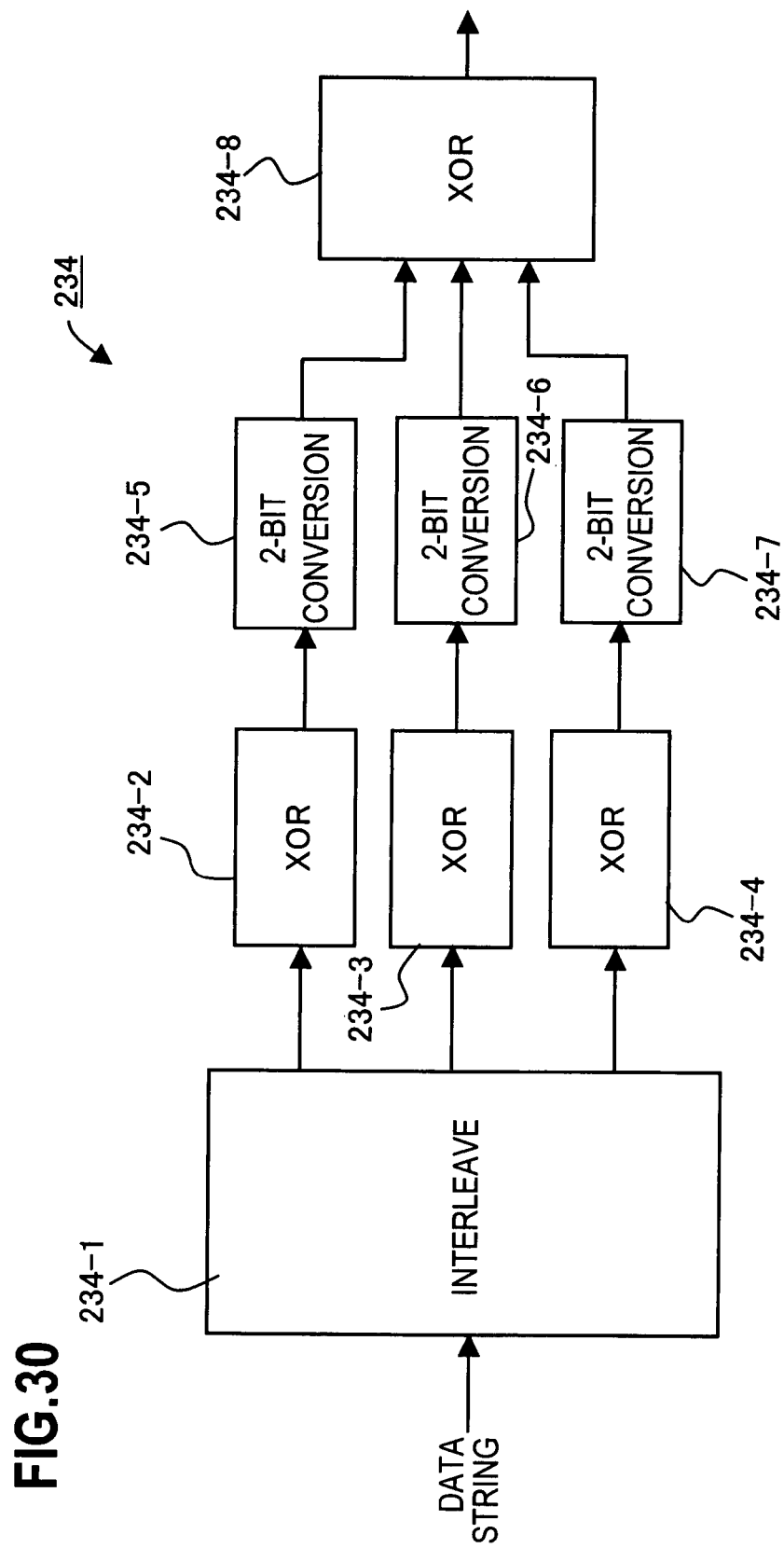
FIG. 30 is a block diagram depicting the parity addition unit in FIG. 29.

In the present embodiment, another parity generator 234, which can calculate parity faster, will be described. FIG. 29 is a diagram depicting high-speed parity calculation, and FIG. 30 is a diagram depicting a configuration of a parity generator 234 for implementing FIG. 29.

As FIG. 29 shows, in the case of the parity polynomial x^2+x+1, the data string of an 80-bit block described in FIG. 6 is distributed into upper, intermediate and lower stages in 3-bit units. And for the distributed bit values of the upper, intermediate and lower stages, an XOR operation is performed respectively. In FIG. 29, the result of the XOR operation is "0", "1" and "0" respectively in the upper, intermediate and lower stages.

Then a 2-bit value is selected respectively from the result of the XOR operation. If the result of the upper stage is "0", the 2-bit value "00" is selected, and if it is "1", the 2-bit value "10" is selected. In the case of the example in FIG. 29, the result of the upper stage is "0", so "00" is selected.

If the result of the intermediate stage is "0", the 2-bit value "00" is selected, and if it is "1", the 2-bit value "11" is selected. In the case of the example in FIG. 29, the result of the intermediate stage is "1", so "11" is selected. If the result of the lower stage is "0", the 2-bit value "00" is selected, and if it is "1", the 2-bit value "01" is selected. In the case of the example in FIG. 29, the result of the lower stage is "0", so "00" is selected.

For the respective selected 2-bit value, an XOR operation is performed for each bit. In the case of the example in FIG. 29, 00+11+00=11. This result of the XOR operation is the parity value to be determined.

In other words, in the expression in FIG. 6, one 80-bit data block is separated into a plurality of blocks, the XOR of each separated block is calculated, and an XOR is determined for the calculation result, then the same result as the expression of FIG. 6 is acquired. In the method in FIG. 6, about 240 times of XOR operations are required since parity is determined from 80-bit block data, but in the case of the parity encoding method according to this embodiment, only 82 times of XOR operations are required, and the calculation volume can be decreased to about ⅓.

To determine parity from 80-bit block data, the parity encoding method according to this embodiment can start calculation from both ends of the 80-bit block data, or can start calculation from both ends of the separated data after the 80-bit block data is separated into a plurality of blocks, so this method is effective for parallel processing. The method in FIG. 6, on the other hand, has difficulty in starting calculation from both ends of the data, and is therefore inappropriate for parallel processing.

FIG. 30 is a block diagram depicting another parity addition unit 234 according to the present invention. As FIG. 30 shows, an interleave circuit 234-1 distributes the 80-bit block data into upper, intermediate and lower stages in 3 bit units. XOR computing units 234-2, 234-3 and 234-4 perform XOR operation respectively for the distributed bit values in the upper stage, intermediate stage and lower stage.

2-bit conversion sections 234-5, 234-6 and 234-7 select the 2-bit values described in FIG. 29 respectively based on the results of the XOR computing units 234-2, 234-3 and 234-4. The XOR circuit 234-8 performs XOR operation for each conversion result to generate a parity.

Other Decoders

Figure 31:
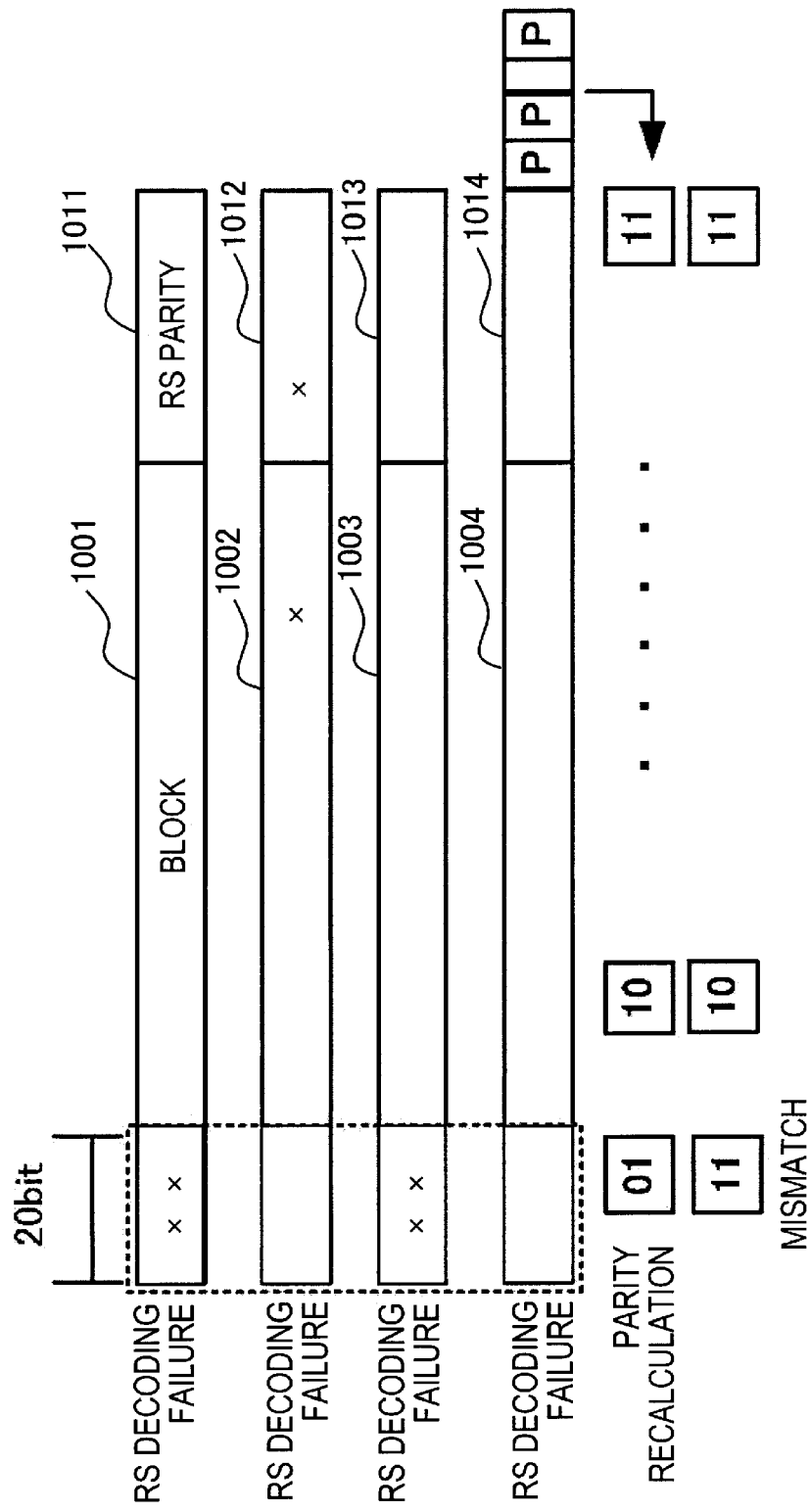
FIG. 31 is a diagram depicting the relationship of the parity check result and the RS decoding failure block for describing the decoding method according to another embodiment of the present invention.

Now other decoders of the present invention will be described. FIG. 31 is a diagram depicting a relationship of a parity error and decoding failure block to describe another decoding method of the present invention, and FIG. 32 shows an error table in the case of FIG. 31.

As described in FIG. 8, the parity/likelihood correction unit 227 or 233 determines a parity in the same way as the parity encoder after all the RS block numbers, for which decoding failed and RS code sections where deinterleave processing was performed, are input. In other words, the RS code section is separated at an 80-bit interval as shown in FIG. 7, and 2-bit parity is determined for each separated block as shown in FIG. 20.

After parity is recalculated, parity value check is performed to check whether the parity value generated by the parity encoder (or high-speed parity encoder) and recalculated parity value match. FIG. 31 shows the decoding result after parity check.

The difference between the example in FIG. 31 from the examples in FIG. 20 and FIG. 22 is that decoding failed in all the RS blocks. Also in FIG. 31, parity values in the first parity block string are different. In parity check, a parity block string, of which values match, is judged as no error, and a parity block string, of which values do not match, is judged as error.

Therefore in FIG. 31, it is judged that the first parity block string has an error. An RS block of which decoding succeeded is judged as no error, and an RS block of which decoding failed is judged as error, so in this example, it is judged that all the RS blocks have error. In FIG. 31, the gray area has an error.

According to the error candidate table 124 in FIG. 32, the probability of error is very high in all the error position candidates of the RS block, unlike FIG. 14. In other words, likelihood is low. In such a case, correction error may occur even if the error candidates are narrowed down to one, as in the case of a prior art.

Figure 33:
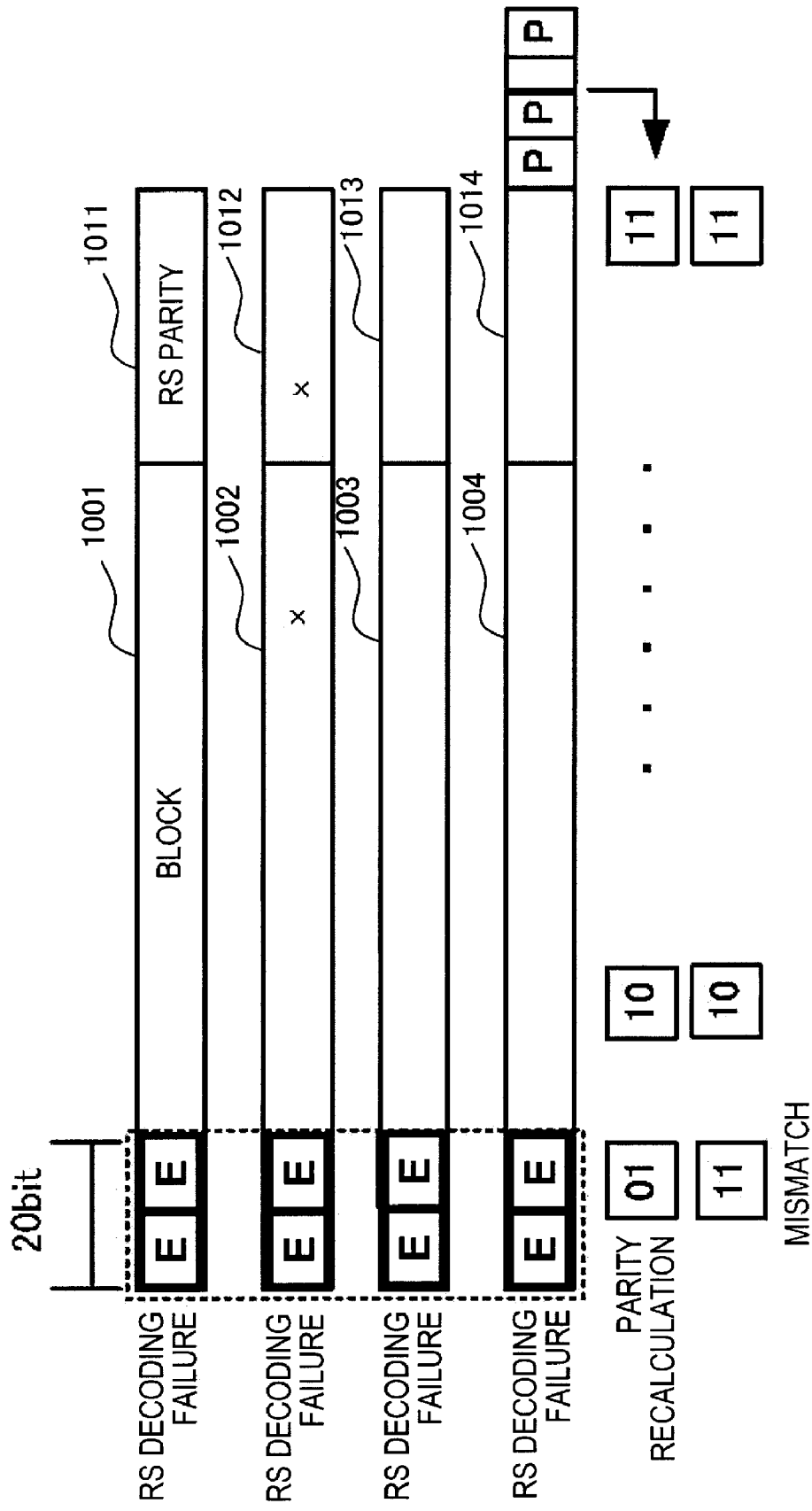
FIG. 33 is a diagram depicting a decoding method according to another embodiment of the present invention.
Figure 34:
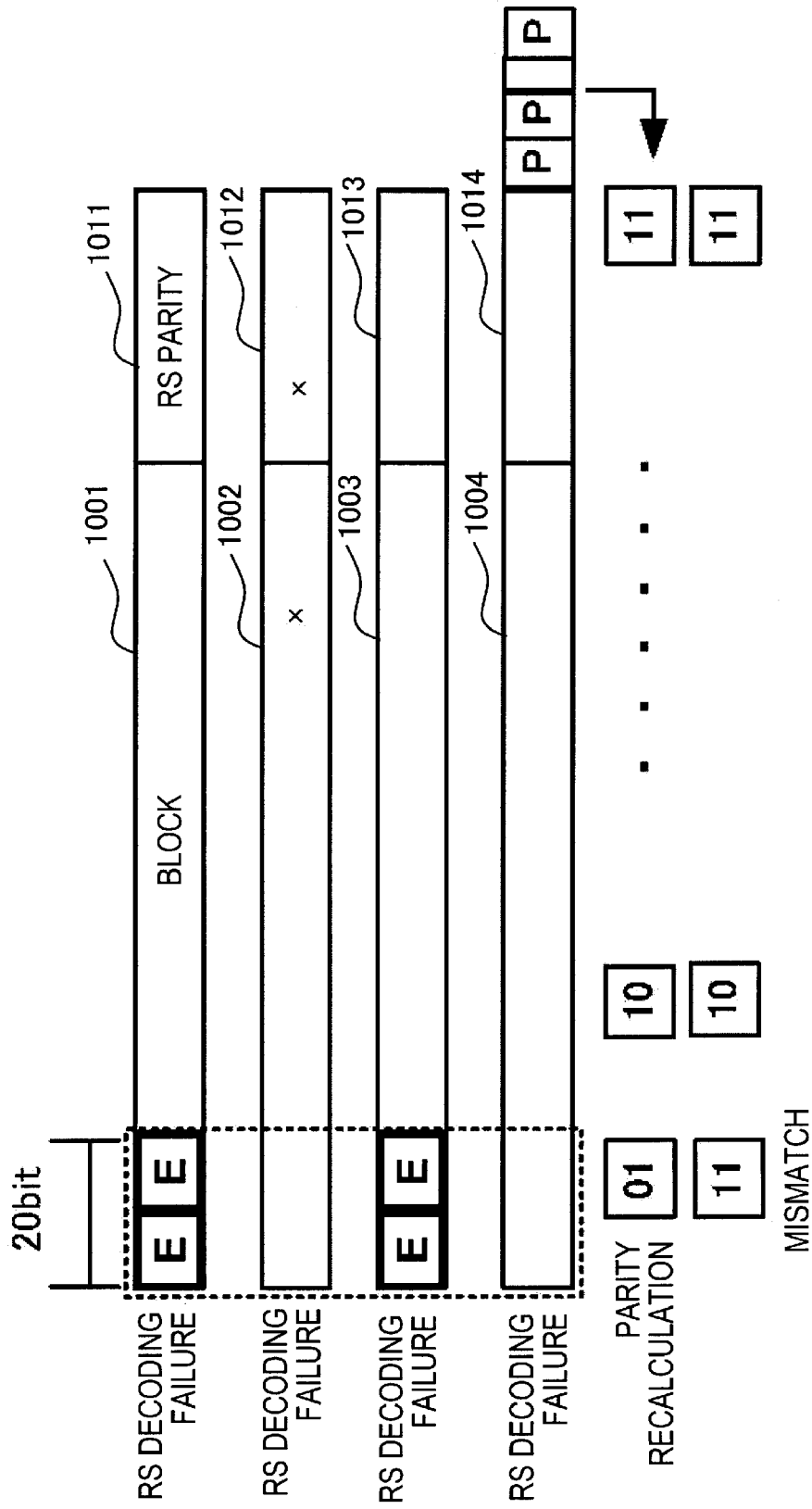
FIG. 34 is a diagram depicting a decoding method according to still another embodiment of the present invention.

FIG. 33 and FIG. 34 are diagrams depicting another decoding method according to the present invention. In this case, as FIG. 33 shows, an erasure flag (E in FIG. 33) is set for an entire parity block string. Or as FIG. 34 shows, an erasure flag (E in FIG. 34) is set for a part of the parity block string.

Then using the RS (ECC) decoder, correction is performed regarding this as erasure processing. As a result, this method can improve error correction performance.

Figure 35:
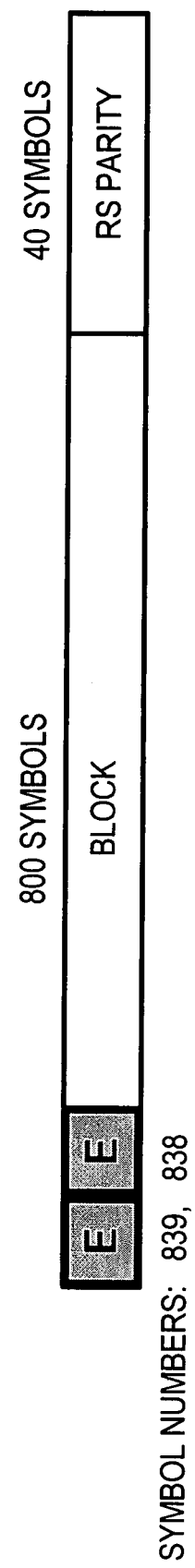
FIG. 35 is a diagram depicting a decoding operation according to another embodiment of the present invention.
Figure 36:
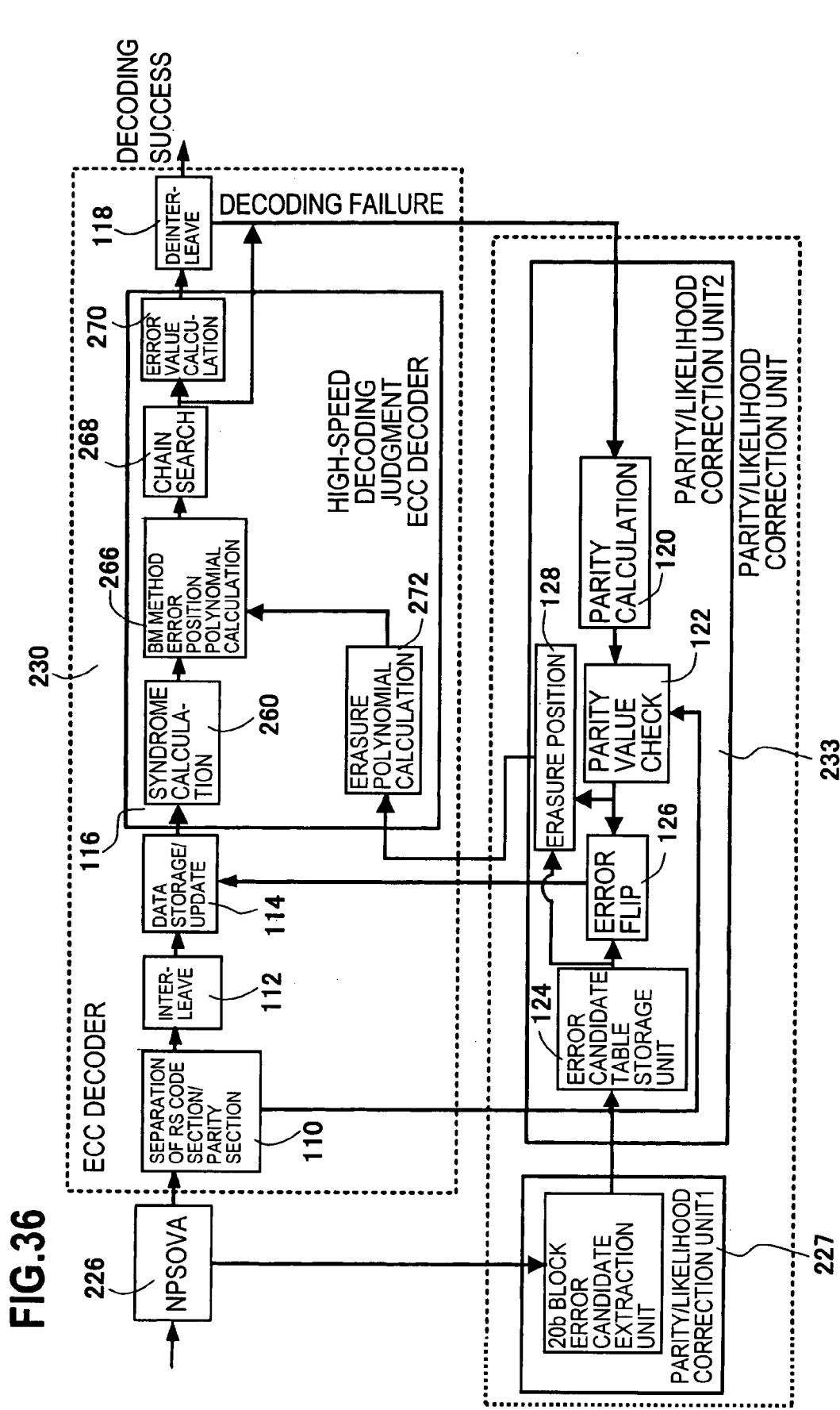
FIG. 36 is a block diagram depicting a decoder according to another embodiment of the present invention.
Figure 40:
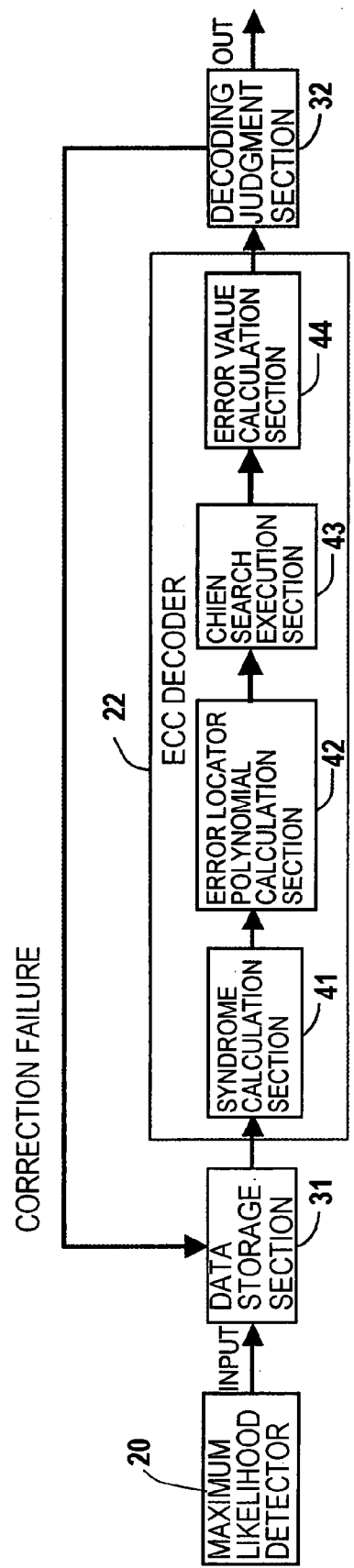
FIG. 40 is a block diagram depicting a conventional error correction circuit.

FIG. 35 is a diagram depicting a decoder according to another embodiment of the present invention, and FIG. 36 is a block diagram depicting a decoder according to another embodiment of the present invention. In FIG. 36, composing elements the same as those in FIG. 9 are denoted with the same reference numbers.

The conventional ECC decoder 116 explained with reference to FIG. 9, which does not have a syndrome value storage section 262 and syndrome value update section 264, can perform erasure correction in addition to normal correction.

In this embodiment, correction is performed using the conventional ECC decoder 116. To perform erasure correction, the erasure position information, in addition to the RS block, must be input to the ECC decoder 116, as shown in FIG. 36.

An erasure position detection section 128 in FIG. 36 determines the erasure position information. This will be described with reference to FIG. 35. If the result of parity value check section 122 is a mismatch, and the likelihood of the candidate of an error block in the error candidate table 124 is low, the erasure position detection section 128 detects the erasure position and outputs it.

In FIG. 35, it is assumed that the RS block is comprised of 800 symbols (1 kByte bit) of a block and 40 symbols of an RS parity, so as to match with the above mentioned encoding. Here if a symbol number is assigned as 0, 1, . . . 839 from the right of the RS block, and the erasure position detection section 128 sets an erasure flag at the 838th and 839th positions, the symbol numbers (838, 839) of the erasure positions are input to the ECC decoder 116. The data values of each 838th and 839th symbol are set to all "0s".

Now an ECC decoder 116 will be described. According to the above mentioned Expression (3), a syndrome calculation section 260 calculates a syndrome polynomial (coefficient of polynomial s1, s2, . . . ) of the data string, and outputs the calculated syndrome polynomial to an error locator polynomial calculation section 266. At this time, the values of 2t (=40) syndrome coefficients si (i=1, 2, . . . 2t) are calculated.

An erasure polynomial calculation section 272 calculates the following erasure polynomial in Expression (10) using the symbol numbers (838, 839) of the erasure positions which were input.

$$\lambda(x) = (1 - \alpha 838 \cdot x)(1 - \alpha 839 \cdot x) \tag{10}$$

The error locator polynomial calculation section 266 then calculates the error locator polynomial by the Berlekamp Massey (BM) method, using the syndrome polynomial and erasure polynomial determined above. The calculation method by BM using the erasure polynomial is known, and is described in Error Control Systems for Digital Communication and Storage, written by Stephen B. Wicker, and published by Prentice Hall.

Then using the determined error locator polynomial, a chien search execution section 268 determines an error position. In other words, the chien search execution section 268 executes a chien search using the error locator polynomial C (x), and calculates $C(\alpha^j)$ (j=0, 1, 2, 3, 4, . . . n) for all positions j on the data string. The error position is a position j where the data string $C(\alpha^j)=0$.

Then the chien search execution section 268 judges whether correction succeeded or not using the syndrome polynomial and the C ($\alpha$j) value, and if correction is judged as a success, the chien search execution section 268 outputs the received data string, syndrome polynomial, erasure polynomial and error locator polynomial to the error value calculation section 270.

If the correction is judged as a failure, a decoding failure flag is set in the currently decoding RS block, and this block number is output. If an error position is specified in this chien search, the error value is calculated. In other words, the error value calculation section 270 corrects the error value at the error position of the data string to a correct value based on a predetermined algorithm, using the syndrome polynomial, erasure polynomial and error locator polynomial.

If the error correction capability t, when erasure correction is not performed, is 20 symbols, then the following relationship is established between the error correction capability t' when the erasure correction is performed and the number of erasures h.

$$2t' + h = 2t = 40$$

In the case of the above example, the number of erasures is 2, so t'=19 is determined by the above expression. This means that 2 erasures and 19 errors can be corrected in the case of the above example. If an error exists at each of 2 erasure positions, this means that a total of 21 symbol errors can be corrected, and errors more than the error correction capability, in the case of not performing erasure correction, can be corrected.

Other Embodiments

In the above embodiment, ECC code was described using Reed Solomon code, but other codes, such as BCH (Bose Chaudhari Hocquengham) code can be used. Interleave was described using four-interleave, but the present invention can be applied to a two- or more interleave configuration, and interleave is not limited to 20-bit units. Parity was 2 bits in the above embodiment, but the present invention can also be applied to a 1-bit or 3- or more bit units. The ECC decoder is not limited to the configuration in FIG. 9, but other configurations can be used. The present invention was described using an example of the recording/reproducing device of a magnetic disk device, but can also be applied to other medium storage devices, such as an optical disk device, and communication devices.

The present invention was described using embodiments, but the present invention can be modified in various ways within the scope of the spirit thereof, and these variant forms shall not be excluded from the scope of the present invention.

A data string is interleaved into a plurality of blocks at every m (m≧2) bit, a parity of an error correcting code is added, and a concatenation type encoded data where a parity bit is added at every m×n bit is created, so an increase in the circuit scale can be prevented even if [the data string] is interleaved into a plurality of blocks and a parity of an error correcting code is generated. Also a deterioration of the correction performance can be prevented since the ECC decoded data string is corrected based on the likelihood of the soft output decoder and the parity check result. Therefore the correction performance of a long sector type recording/reproducing device, which is used for Windows® VISTA®, can be improved while preventing an increase in the circuit scale thereof.

What is claimed is:

1. A decoder for decoding an encoded data string comprising error correction code words and a parity bit that is created for a predetermined number of bits of error correcting code words, the error correction code words comprising data string and a parity of the error correcting code that is generated from data string of each block of which the data string is interleaved into n (n≧2) blocks at every m (m≧2) bits, the decoder comprising:
 a soft output decoder for decoding the encoded data string that is received to a code bit string and outputting the code bit string and the likelihood of each bit; and
 an ECC decoding circuit for repeating an error correction decoding using an error correcting code of the code bit string from the soft output decoder, and a correction decoding of the code bit string based on the likelihood according to the error detection using the parity bit,
 wherein the ECC decoding circuit comprises:
  an ECC decoder for performing error correction using the error correcting code of the code bit string of the soft output decoder; and
  a parity/likelihood correction unit for performing an error detection using the parity bit according to a failure of the decoding of the ECC decoder, and correcting the code bit string that is input to the ECC decoder depending on the likelihood according to the error detection result.

2. The decoder according to claim 1, further comprising:
 a separation section for separating the parity bit from the code bit string of the soft output decoder and outputting the code bit string to the parity/likelihood correction unit;
 an interleave section for interleaving the code bit string after the parity bit is separated into n (n≧2) blocks of a data string at every m (m≧2) bit; and
 a data storage section for storing the interleaved data string of each block,
 wherein the ECC decoder performs error correction of the data string of each block of the data storage section using the error correcting code, and the parity/likelihood correction unit corrects the data string of the data storage unit.

3. The decoder according to claim 2, wherein when the decoding fails, the parity/likelihood correction unit receives an identifier of the block in which the decoding fails from the ECC decoder, and performs correction using the likelihood targeting the m bits of data of which error is detected by the parity bit of the block in which the decoding fails.

4. The decoder according to claim 3, wherein the parity/likelihood correction unit calculates a parity bit for every m×n bit of the error correcting code word of the ECC decoder, and specifies the m bits of data of which error is detected by comparison of the calculated parity bit for every m×n bit and the corresponding separated parity bit.

5. The decoder according to claim 4, wherein the parity/likelihood correction unit calculates a parity error value from an addition result of the calculated parity bit after the error detection and the separated parity bit, and specifies an error generation position at m bits of the data by comparison of the parity bits.

6. The decoder according to claim 4, wherein the parity/likelihood correction unit specifies an error candidate bit based on the likelihood of each bit of the error-detected m bits.

7. The decoder according to claim 5, wherein the parity/likelihood correction unit further comprises a table of error candidate positions corresponding to the parity error values according to a generation polynomial of the parity bit,
 and wherein the parity/likelihood correction unit refers to the table by the parity error value, and specifies the error generation position of the m bits of data based on the reference result and the likelihood.

8. The decoder according to claim 3, wherein the parity/likelihood correction unit extracts a bit position of which likelihood is relatively low based on the likelihood of each bit out of the m bits as the correction candidate in m bit units.

9. The decoder according to claim 2, wherein the parity/likelihood correction unit flips the data at the error generation position of the m bits of data, and updates the data string of the data storage unit.

10. The decoder according to claim 1, wherein the error correction code of the encoding data string is a Reed Solomon code.

11. An encoding/decoding device comprising:
 an encoder comprising:
  an ECC encoder for creating an error correcting code word by interleaving a data string into n (n≧2) blocks of a data string at every m (m≧2) bit, generating a parity of an error correcting code from the interleaved data string of each block, and adding the parity of the error correcting code of each block to the data string; and
  a parity encoder for creating a parity bit at every predetermined number of bits of error correcting code words, and adding the parity bit to error correcting code words;
 a decoder comprising:
  a soft output decoder for decoding the encoded data string that is received to a code bit string, and outputting the code bit string and the likelihood of each bit; and
  an ECC decoding circuit for repeating an error correction decoding using an error correcting code of the code bit string of the soft output decoder and a correction decoding of the code bit string based on the likelihood according to the error detection using the parity bit,
wherein the ECC decoding circuit comprises:
- an ECC decoder for performing error correction using the error correcting code of the code bit string of the soft output decoder; and
- a parity/likelihood correction unit for performing an error detection using the parity bit according to the failure of the decoding of the ECC decoder, and correcting the code bit string that is input to the ECC decoder depending on the likelihood according to the error detection result.

12. The encoding/decoding device according to claim 11, wherein the error correcting code is a Reed Solomon code.

13. A recording/reproducing device comprises:
- a head for writing and reading data to/from a storage medium;
- an ECC encoder for interleaving a data string into n (n≧2) blocks of a data string, which is to be written to the storage medium, at every m (m≧2) bit, generating a parity of an error correcting code from the interleaved data string of each block, and adding the parity of the error correcting code of each block to the data string;
- a parity encoder for creating a parity bit at every predetermined number of bits of error correcting code words, adding the parity bit to error correcting code words and outputting the result to the head;
- a soft output decoder for decoding an encoded data string read from the head to a code bit string, and outputting the code bit string and the likelihood of each bit; and
- an ECC decoding circuit for repeating an error correction decoding using the parity of the error correcting code of the code bit string of the soft output decoder, and a correction decoding of the code bit string based on the likelihood according to the error detection using the parity bit, wherein the ECC decoding circuit comprises:
- an ECC decoder for performing error correction using the error correcting code of the code bit string of the soft output decoder; and
- a parity/likelihood correction unit for performing an error detection using the parity bit according to a failure of the decoding of the ECC decoder, and correcting the code bit string that is input to the ECC decoder depending on the likelihood according to the error detection result.

14. The recording/reproducing device according to claim 13, wherein the error correcting code is a Reed Solomon code.

* * * * *